(12) United States Patent
Saito

(10) Patent No.: US 7,084,022 B2
(45) Date of Patent: Aug. 1, 2006

(54) METHOD OF MANUFACTURING A SEMICONDUCTOR DEVICE INCLUDING FORMING A PATTERN, AN INTERLAYER INSULATION FILM, EXPOSING THE PATTERNING AND FLATTENING

(75) Inventor: Tomohiro Saito, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 39 days.

(21) Appl. No.: 10/730,903

(22) Filed: Dec. 10, 2003

(65) Prior Publication Data

US 2005/0127460 A1 Jun. 16, 2005

(30) Foreign Application Priority Data

Dec. 10, 2002 (JP) ............................. 2002-358248

(51) Int. Cl.
  *H01L 21/338* (2006.01)
  *H01L 21/3205* (2006.01)
  *H01L 21/302* (2006.01)
  *H01L 21/461* (2006.01)

(52) U.S. Cl. .................. 438/183; 438/587; 438/691

(58) Field of Classification Search ................ 438/183, 438/587, 691
See application file for complete search history.

(56) References Cited

U.S. PATENT DOCUMENTS

| 6,054,355 | A | 4/2000 | Inumiya et al. | 438/296 |
| 2003/0032231 | A1* | 2/2003 | Efland et al. | 438/200 |
| 2003/0036025 | A1* | 2/2003 | Hirooka | 430/394 |

FOREIGN PATENT DOCUMENTS

| JP | 04-123439 | 4/1992 |
| JP | 2000-294557 | 10/2000 |
| KR | 10-2002-0089998 | 11/2002 |

OTHER PUBLICATIONS

Saito et al., "Plasma-Damage-Free Gate Process Using Chemical Mechanical Polishing for 0.1 μm MOSFETs," Jpn. J. Appl. Phys. (Apr. 1999), 38:2227-31.
Copy of Korean Office Action citing KR 10-2002-0089998.

* cited by examiner

*Primary Examiner*—William M. Brewster
(74) *Attorney, Agent, or Firm*—Finnegan, Henderson, Farabow, Garrett & Dunner, L.L.P.

(57) ABSTRACT

A method of manufacturing a semiconductor device comprises: forming a first pattern in a first region over a semiconductor substrate; forming a second pattern in a second region separated from the first region over the semiconductor substrate; depositing an interlayer insulation film to cover the first and second patterns; forming a photoresist film on the interlayer insulation film; treating the photoresist film in stepper exposure and development to form a photoresist pattern of a photomask having its device pattern matched with the first pattern and its alignment marks matched with the second pattern; selectively etching off the interlayer insulation film over the first and second patterns, with the photoresist pattern; and after removing the photoresist pattern, flattening the interlayer insulation film to expose the surfaces of the first and second patterns, respectively.

12 Claims, 24 Drawing Sheets

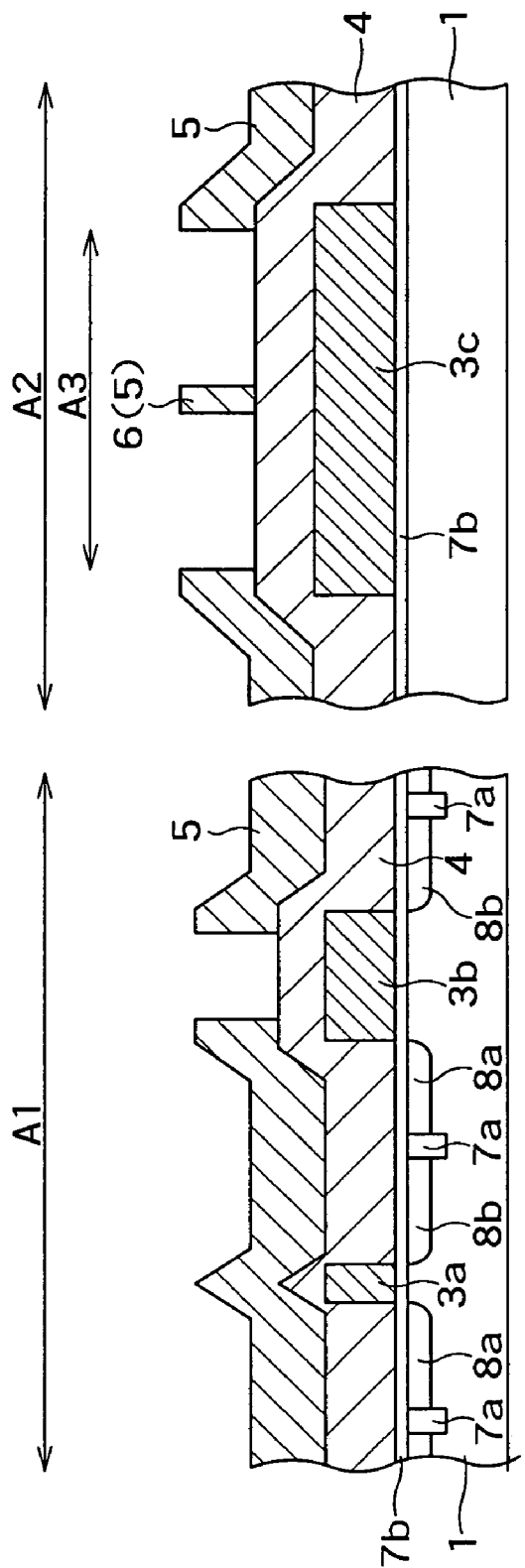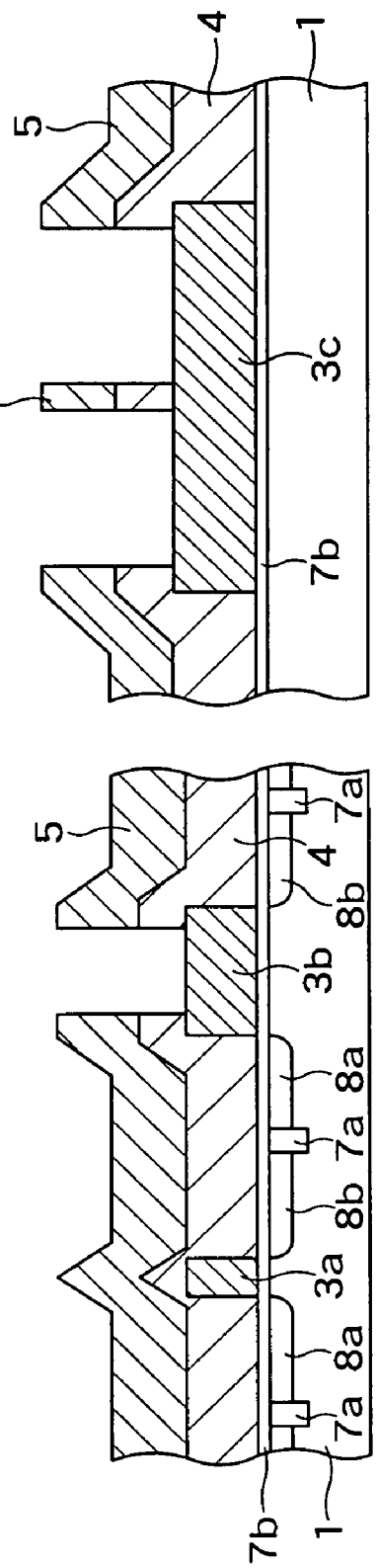
FIG. 2A
FIG. 2B

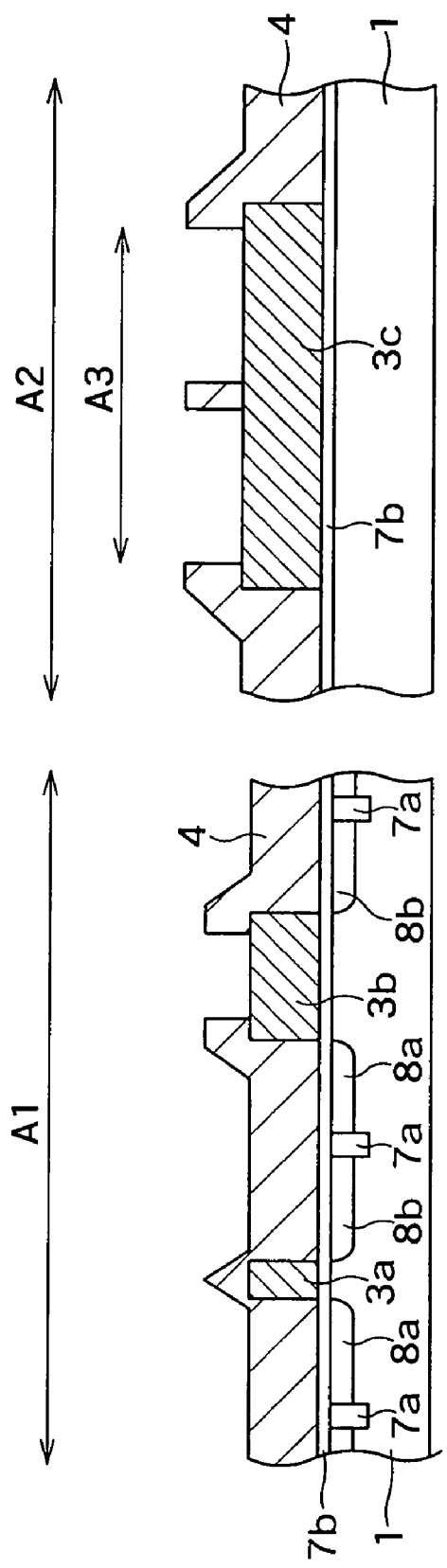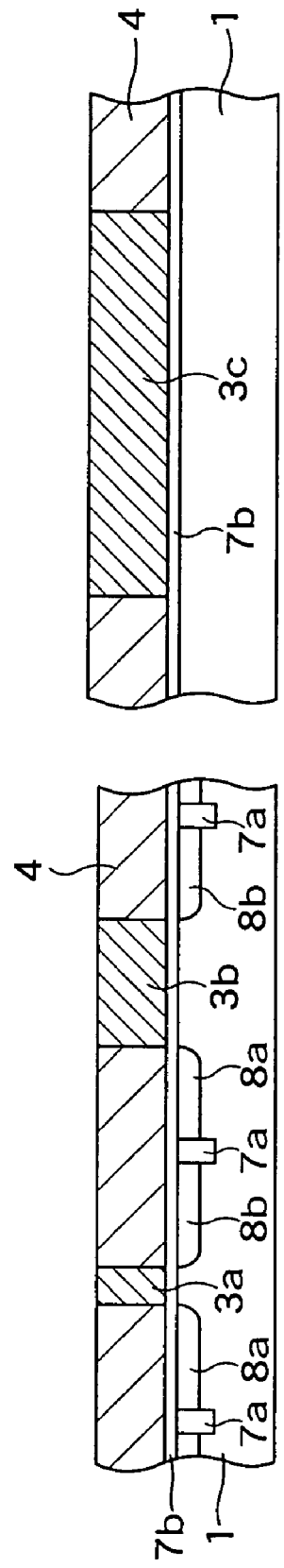
FIG. 3A
FIG. 3B

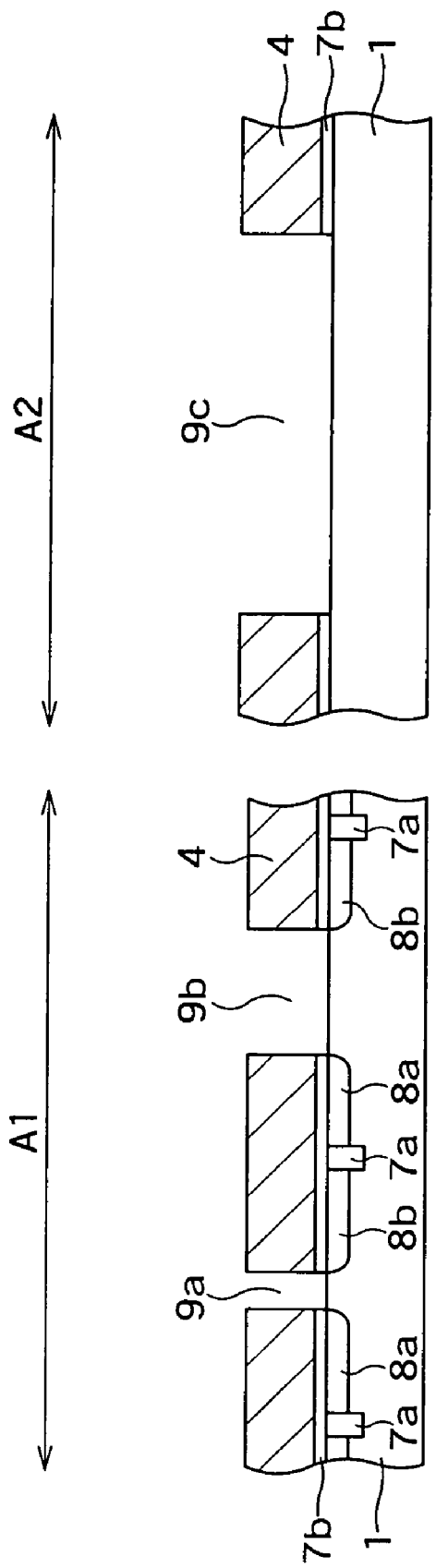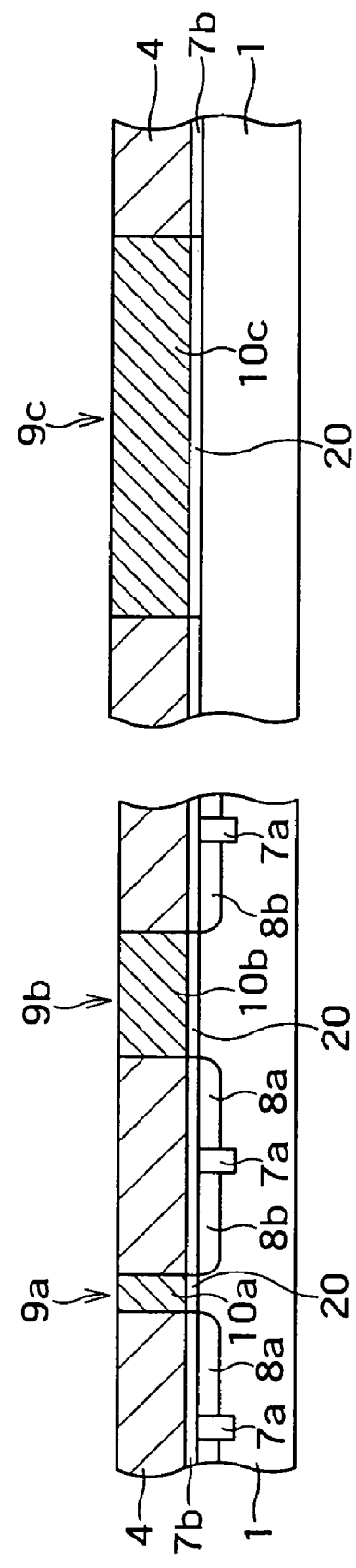

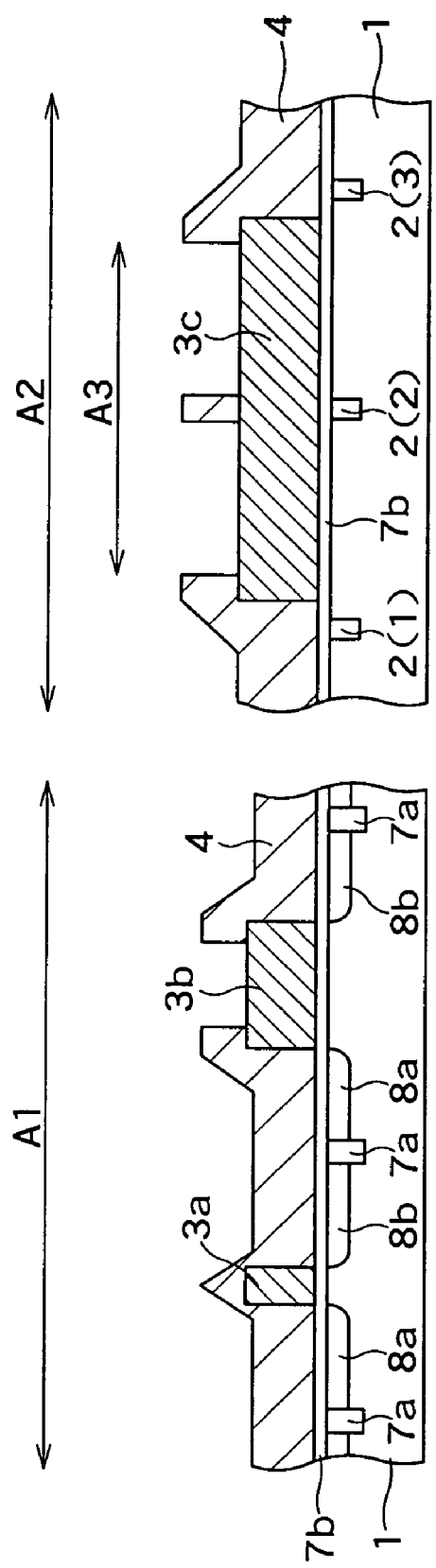
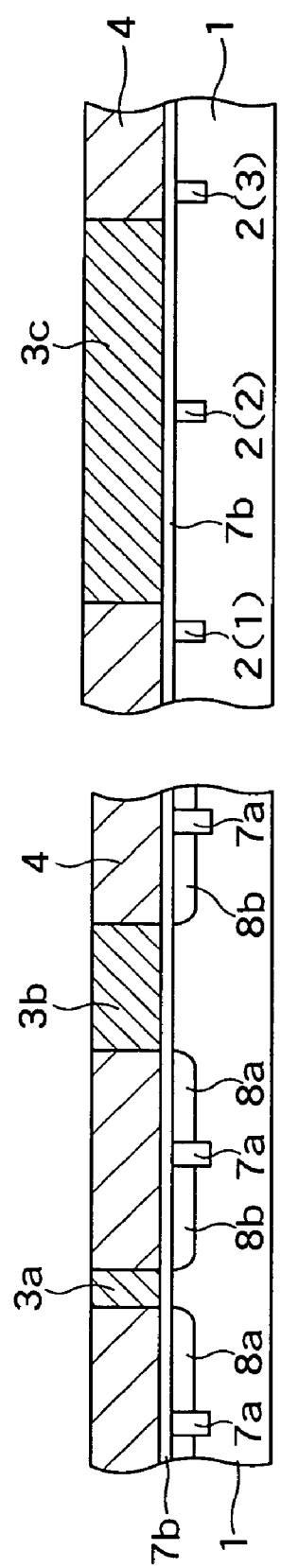
FIG. 8A
FIG. 8B

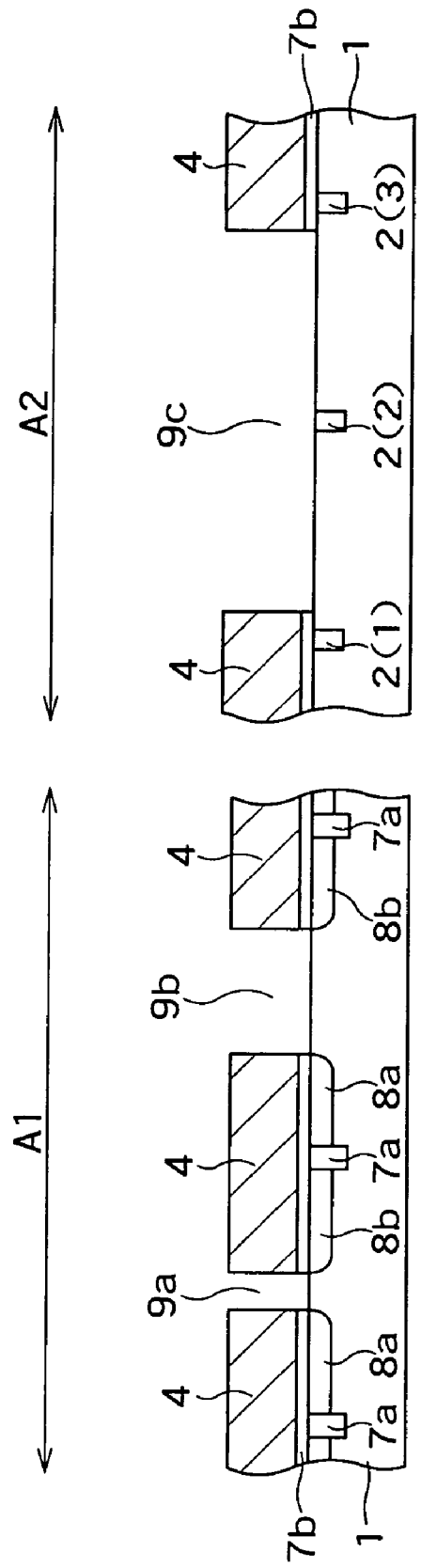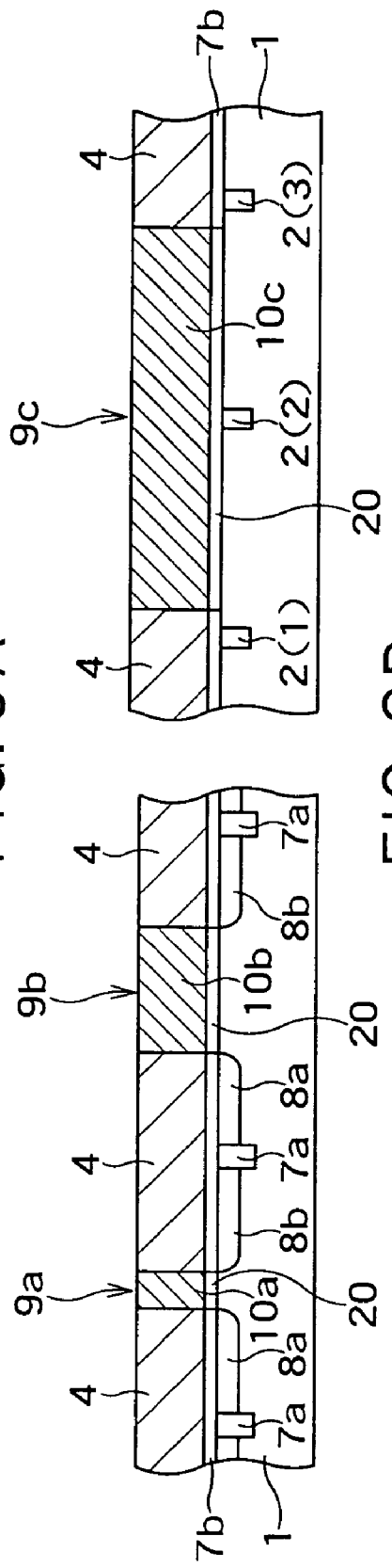

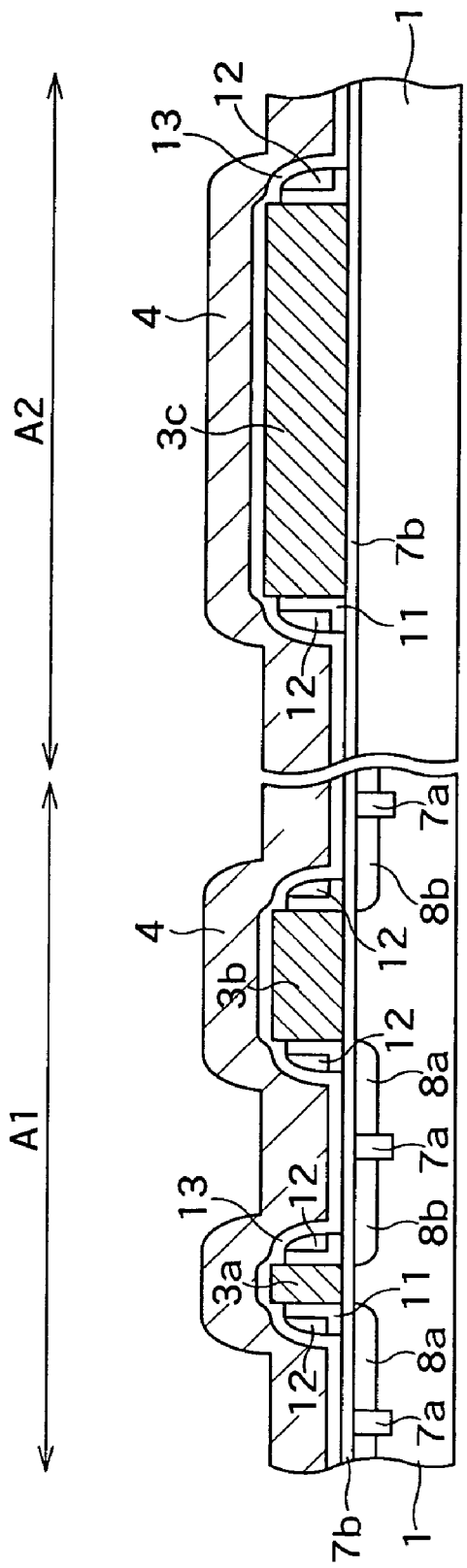
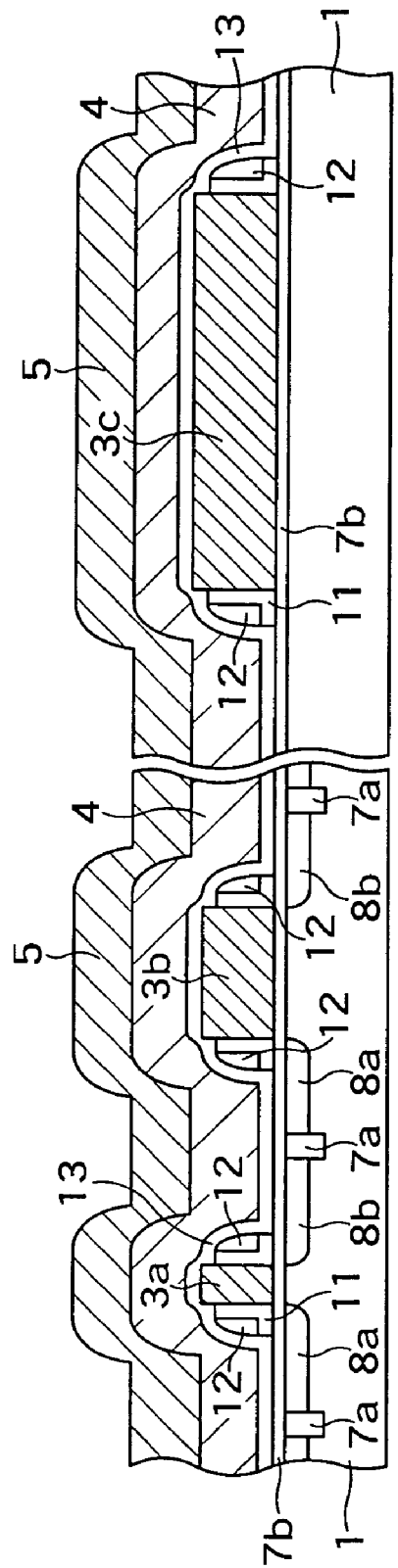
FIG. 11A
FIG. 11B

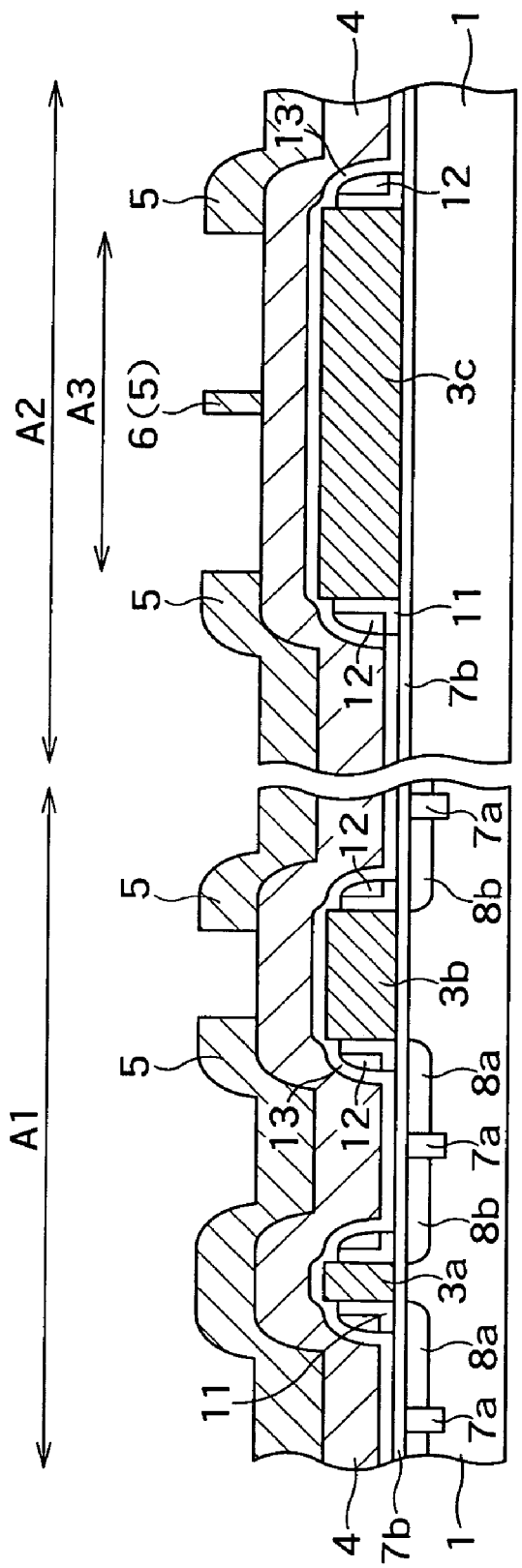
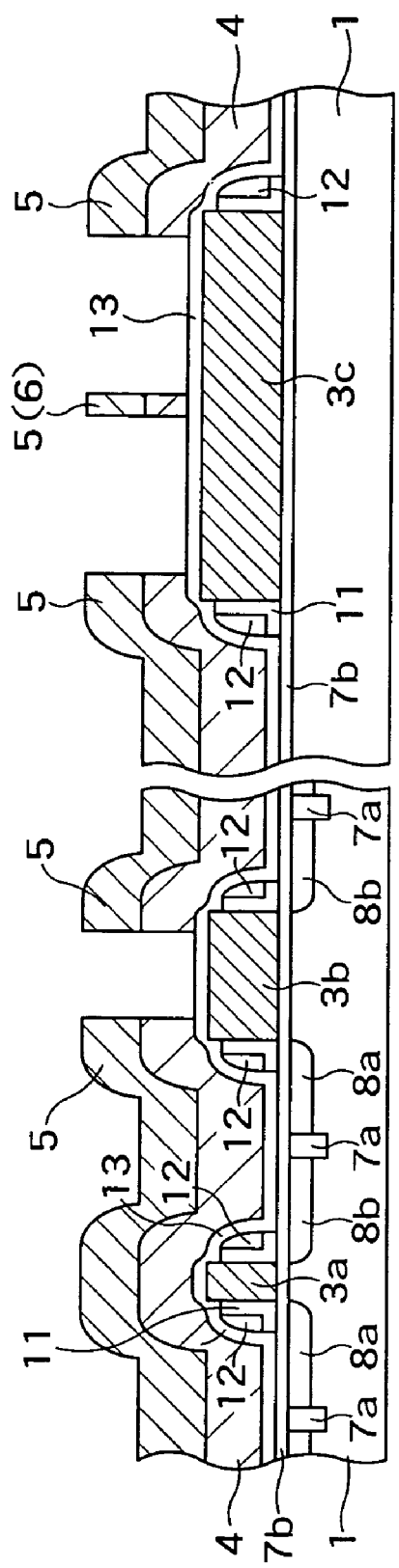
FIG. 12A
FIG. 12B

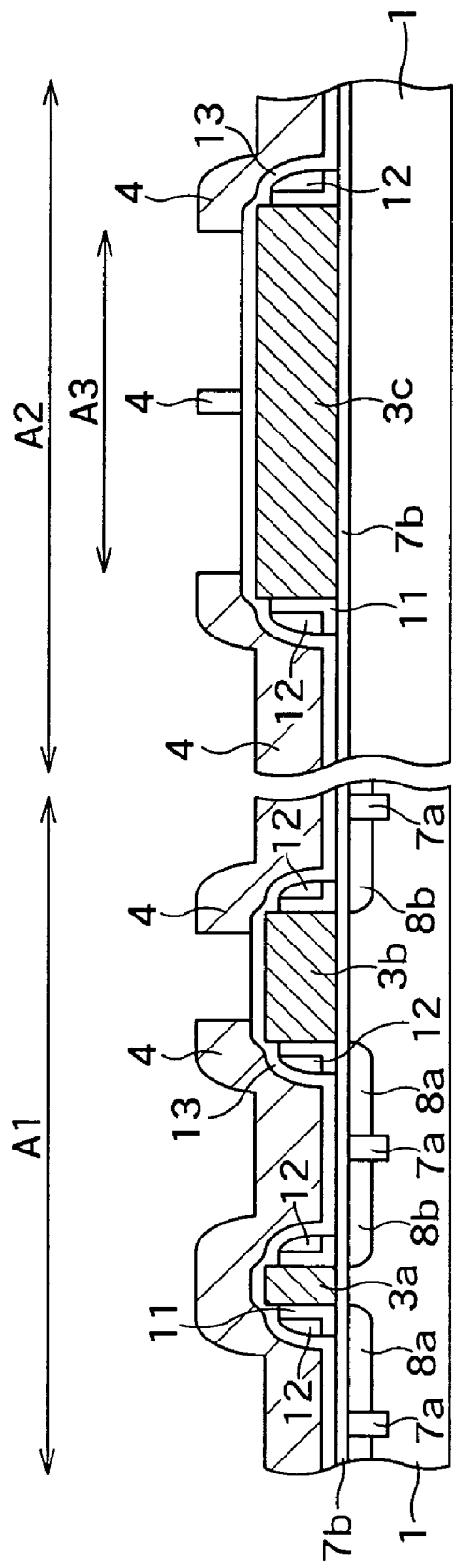
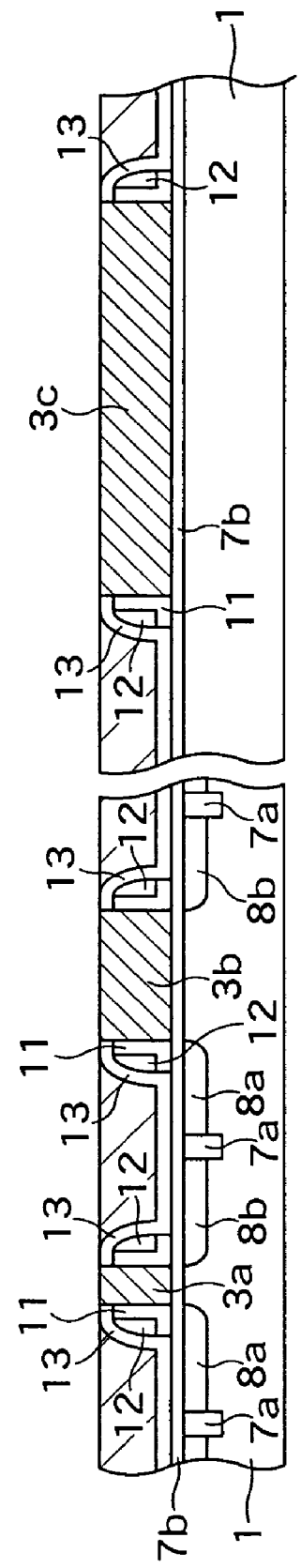
FIG. 13A
FIG. 13B

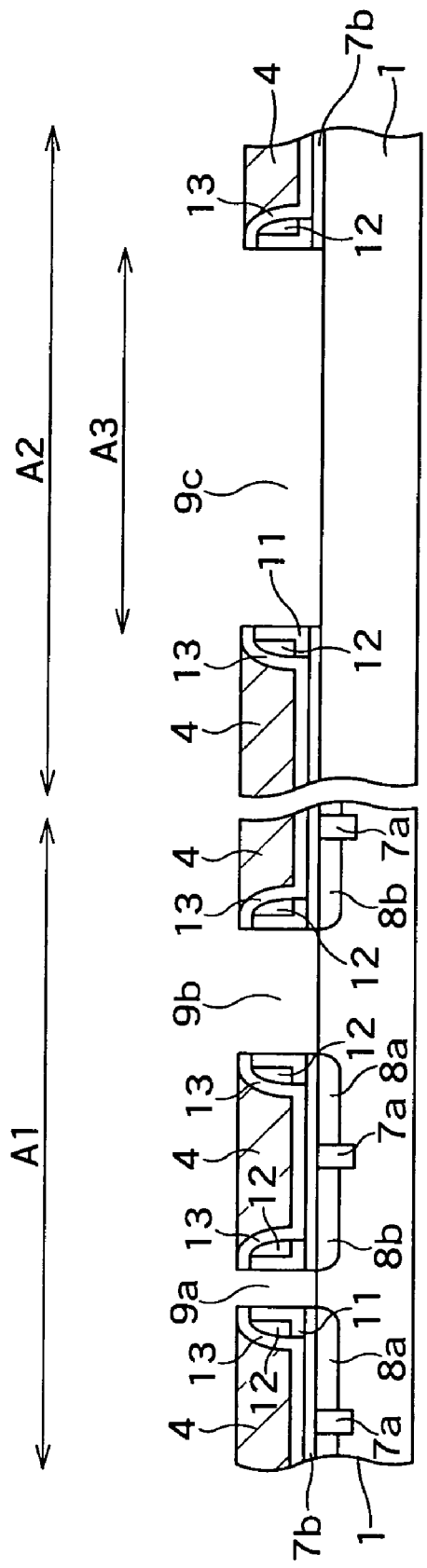
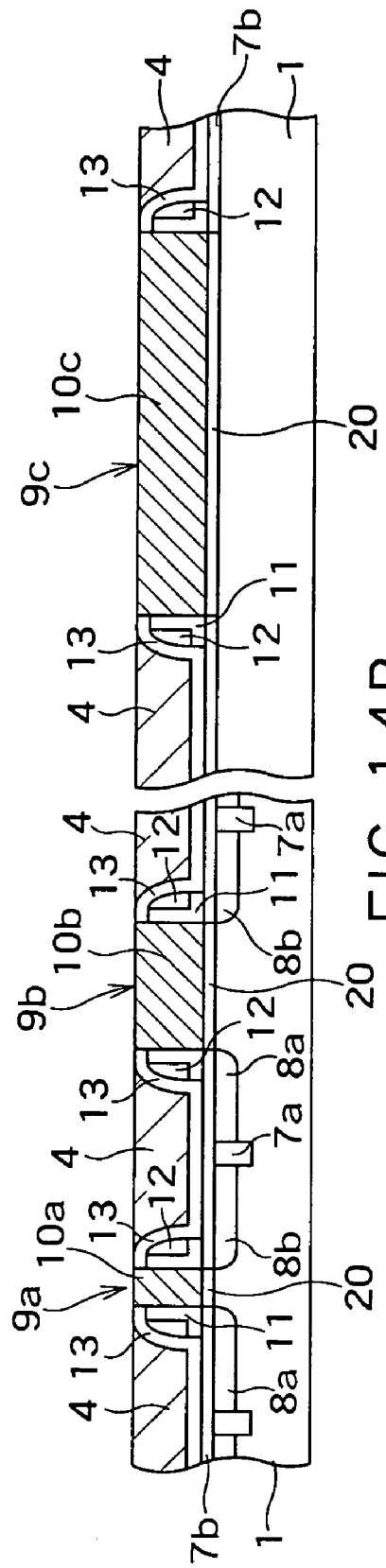
FIG. 14A
FIG. 14B

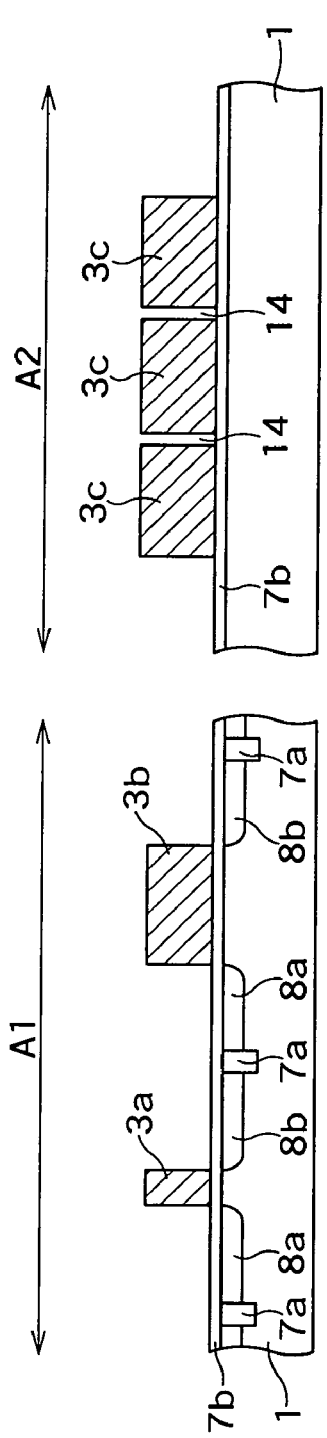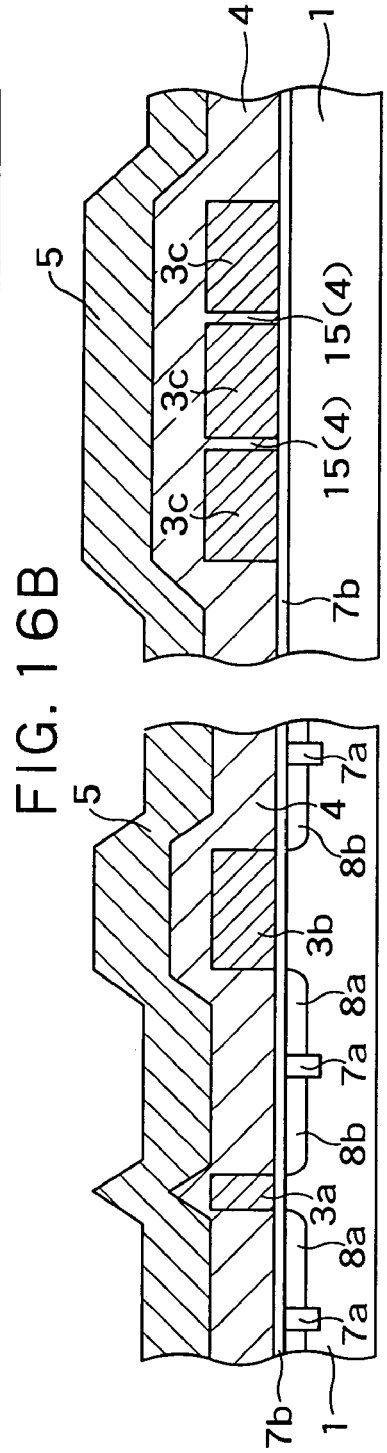
FIG. 16A
FIG. 16B
FIG. 16C

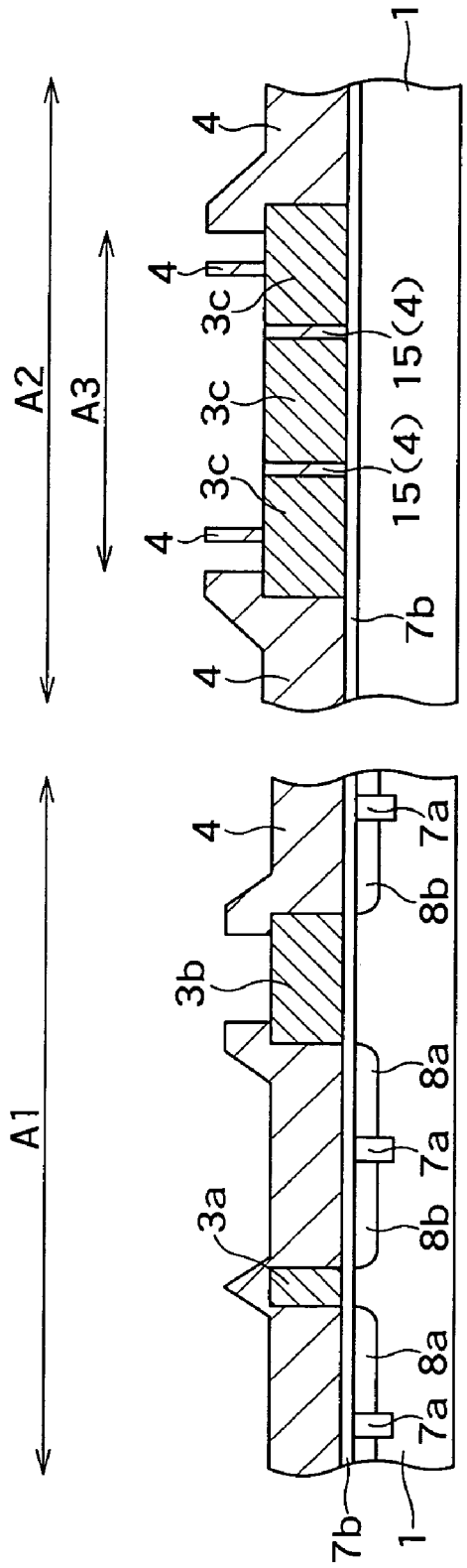
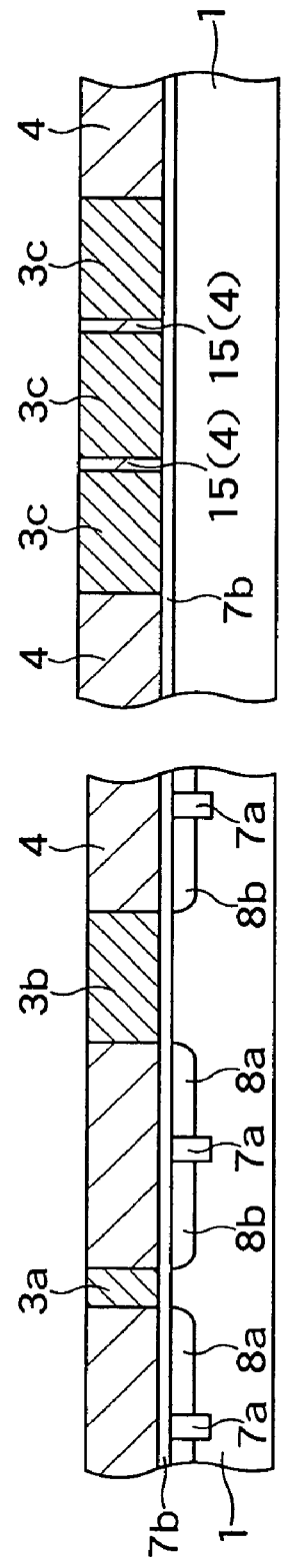
FIG. 18A
FIG. 18B

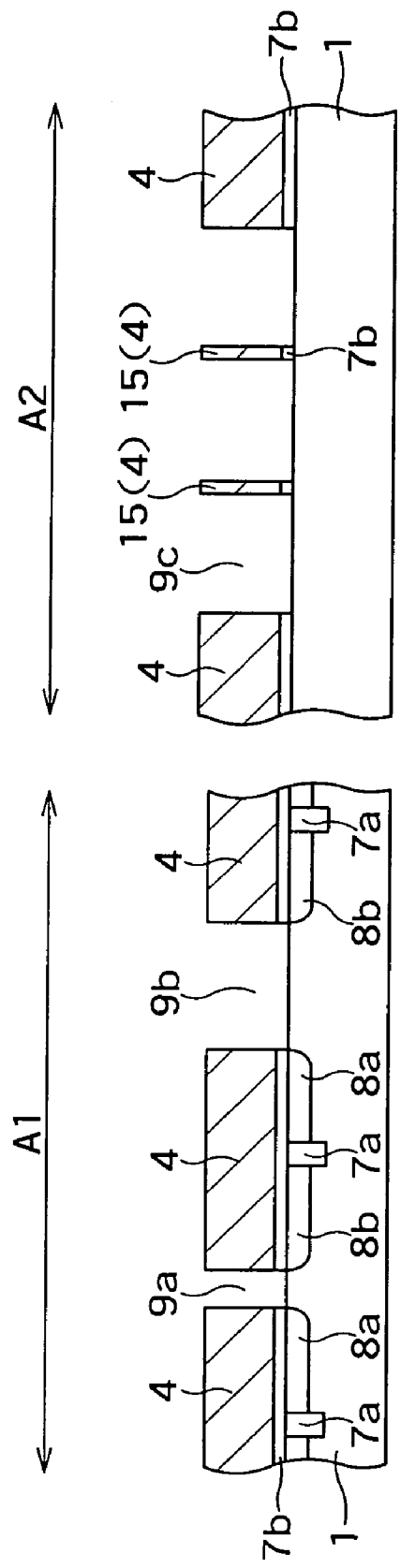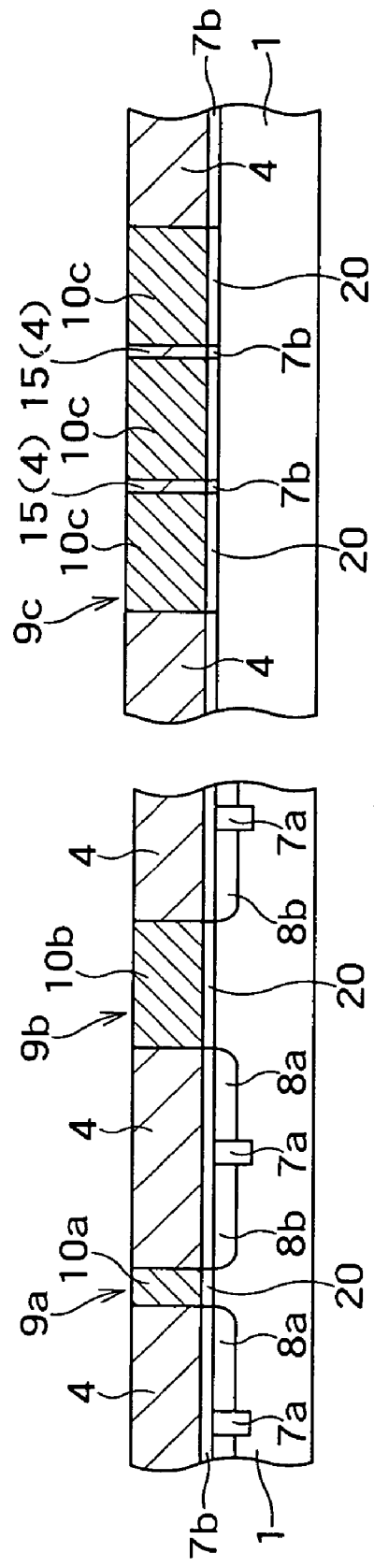
FIG. 19A
FIG. 19B

METHOD OF MANUFACTURING A SEMICONDUCTOR DEVICE INCLUDING FORMING A PATTERN, AN INTERLAYER INSULATION FILM, EXPOSING THE PATTERNING AND FLATTENING

CROSS REFERENCE TO RELATED APPLICATIONS

This application is based upon and claims the benefit of priority from the prior Japanese Patent Application No. 2002-358248, filed on Dec. 10, 2002; the entire contents of which are incorporated herein by reference.

BACKGROUND OF THE INVENTION

The present invention relates to a semiconductor device and a method of manufacturing the same.

A metal gate transistor can be manufactured, for example, through a damascene gate electrode formation process as disclosed in Japanese Patent Laid-open (Unexamined) Publication No. H04-123439 (1992).

FIGS. 23A to 23C are sectional views illustrating part of process steps of a prior art manufacturing process of a damascene gate transistor.

First, as can be seen in FIG. 23A, a silicon substrate 31, which is provided with shallow trench isolations (STIs) 32 serving as device isolation film in advance, is superposed with an oxidation film 33, and then is formed with dummy gate electrodes 34a and 34b, respectively, over the oxidation film. The dummy gate electrode 34b in the figure is designed to be larger in lateral width than the dummy gate electrode 34a. With masks of the dummy gate electrodes 34a and 34b, impurities are implanted in the silicon substrate 31 to form source and drain regions 35a and 35b. After that, an interlayer insulation film 36, which may be an oxidation film, is deposited to cover the dummy gate electrodes 34a and 34b, for example.

Then, as shown in FIG. 23B, the interlayer insulation film 36 undergoes chemical mechanical polishing (CMP) to flatten the surface, and thus, the dummy gate electrodes 34a and 34b have their respective top sides exposed.

Next, as illustrated in FIG. 23C, the dummy gate electrodes 34a and 34b are removed by chemical dry etching (CDE) to form gate trenches 37a and 37b. After that, the gate trenches 37a and 37b are filled with metal to form gate electrodes (not shown), respectively.

References related to the present invention are as follows:
(1) Japanese Patent Laid-open Publication No. H12-294557, and
(2) Japanese Patent Laid-open Publication No. H04-123439.

In such a damascene gate electrode formation process, however, as can be seen in FIG. 23A, the interlayer insulation film 36 is deposited over the dummy gate electrode 34b occupying a wider range, compared to that over the dummy gate electrode 34a. Hence, a polishing rate to the insulation film by means of CMP is slower over the dummy gate electrode 34b than over the dummy gate electrode 34a, and when the CMP is completed, a residual insulation film 36' overlies the dummy gate electrode 34b, as recognized in FIG. 23B. Hence, as is apparent in FIG. 23C, while the dummy gate electrode 34b is being etched away, the residual interlayer insulation film 36' inhibits the underlying electrode from being etched. To cope with this, the CMP may be carried out for an extended period of time and ensure that the layer insulation film 36' can be removed from the top of the dummy gate electrode 34b in advance. With this option of the extended CMP, however, the interlayer insulation film 36 is overpolished in a region free from the dummy gate, which results in an undesirably reduced thickness of the interlayer insulation film.

In order to avoid a trouble of the residual film over the dummy gate electrode 34b, as described in more details in conjunction with FIGS. 24A and 24B, one alternative is selectively etching part of the interlayer insulation film 36 from the top of the dummy gate electrode 34b. According to this method, as can be seen in FIG. 24B, the polishing rate is almost identical in either region over the dummy gate electrode 34a or over the dummy gate electrode 34b, and the finish is uniform throughout the polished surface. Thus, the aforementioned problem of overpolishing no longer occurs. In this manner, however, another trouble of dishing is caused, which will be detailed below.

FIGS. 24A to 24C and FIGS. 25A and 25B are cross-sectional views illustrating steps of the damascene gate electrode formation process which follows the above-mentioned way.

An area A1 on the left half of each figure is indicative of a device formation area where devices such as damascene gate electrodes and the like are to be formed. An area A2 on the light half of each figure is indicative of a target area where targets for alignment and/or inspection targets for misalignment are to be formed. Herein, A3 denotes a mark area. The mark area A3 is formed as an area of photoresist film which is used during a alignment of a substrate with a photomask in a photolithography process and which is patterned so as to match with alignment marks in a reticle (photomask) or marks for forming inspection targets for misalignment. In other words, this is an area of photoresist film that has a pattern, such as the alignment marks of the substrate with the photomask, traced during a procedure of exposure to light with the photomask.

The damascene gate electrode formation process will now be described in details.

First, as shown in FIG. 24A, a substrate 31, which is provided in advance with shallow trench isolations (STIs) 32 serving as device isolation film and targets 40(1), 40(2), 40(3), and so forth used for alignment, has its surface formed with an oxidation film 33 by for example thermal oxidation, and after that, polysilicon is deposited thereover and then patterned to leave the dummy gate electrodes 34a and 34b. Next, with masks of the dummy gate electrodes 34a and 34b, impurity ions are implanted and diffused to form the source and drain regions 35a and 35b, respectively. Then, the interlayer insulation film 36 such as silicon oxidation film is deposited to cover the dummy gate electrodes 34a and 34b. Furthermore, a photoresist film is deposited by means of spin coating, and then, the lithography method is used to pattern the surface into a photoresist film 38 which serves to selectively etch the interlayer insulation film 36.

The process of the pattering into the photoresist film 38 will now be detailed.

A photomask (not shown) patterned into a desired design is aligned with the substrate. This is attained by a position matching of alignment marks in the photomask with the target 40(2) formed in the target area A2 throughout the substrate 31. When aligned, the substrate 31 is exposed to light and then developed. In this way, the resist film is patterned and then used to selectively remove the interlayer insulation film 36 from the top of the dummy gate electrode 34b. The exposure and development provide the resist film with a pattern (or a CMP auxiliary mask) 39 that matches with a pattern of the alignment marks. A plan view of the CMP auxiliary mask 39 is illustrated in FIG. 26. A sectional view of the CMP auxiliary mask 39 along the line D—D in FIG. 26 is represented as the CMP auxiliary mask 39 in FIG. 24A.

As can be seen in FIG. 24B, the photoresist film 38 is used to selectively remove the interlayer insulation film 36 from the top of the dummy gate electrode 34b by an appropriate means of anisotropic etching such as reactive ion etching (RIE). At this stage of the process, the interlayer insulation film 36 beneath the mark area A3 is to be selectively etched, and eventually, after the interlayer insulation film 36 is etched away, the silicon substrate (or the oxidation film 33) is exposed.

Then, as recognized in FIG. 24C, the interlayer insulation film 36 is flattened by means of CMP to expose upper surfaces of the dummy gate electrodes 34a and 34b, respectively.

Next, as shown in FIG. 25A, the exposed dummy gate electrodes 34a and 34b are etched away to form gate trenches 42a and 42b.

After that, as can be seen in FIG. 25B, the silicon substrate 31 has its exposed surface or oxidation film 30 etched away, and then, it has its etched surface superposed with a gate insulation film 50 of oxide. In addition to that, the gate trenches 42a and 42b are filled with a material such as polysilicon, metal or the like, to create gate electrodes 43a and 43b, respectively.

In the above mentioned stage of CMP (FIG. 24C), however, part of the silicon substrate 31 beneath the mark area A3 is polished as well as part of the interlayer insulation film 36 around the mark area A3; that is, the pattern (i.e., film thickness) of the interlayer insulation film 36 around the mark area A3 is altered. This altered patterning is called dishing and designated by a reference numeral 41. When the film thickness of the interlayer insulation film 36 is altered, the targets 40(1) and 40(3), if used as targets for alignment, for example, in forming an additional layer over the interlayer insulation film 36, might be read with increased errors. Such errors, when increased in reading the targets such as the targets 40(1) and 40(3), further lead to adverse effects like misalignment of layers stacked over the substrate.

SUMMARY OF THE INVENTION

According to one aspect of the invention, there is provided a method of manufacturing a semiconductor device, comprising:

forming a first pattern in a first region over a semiconductor substrate;

forming a second pattern in a second region separated from the first region over the semiconductor substrate;

depositing an interlayer insulation film to cover the first and second patterns;

forming a photoresist film on the interlayer insulation film;

treating the photoresist film in stepper exposure and development to form a photoresist pattern of a photomask having its device pattern matched with the first pattern and its alignment marks matched with the second pattern;

selectively etching off the interlayer insulation film over the first and second patterns, with the photoresist pattern; and after removing the photoresist pattern, flattening the interlayer insulation film to expose the surfaces of the first and second patterns, respectively.

According to another aspect of the invention, there is provided a method of manufacturing a semiconductor device, comprising:

forming dummy gate electrodes in a device formation area of a semiconductor device, and forming a dishing inhibiting pattern in a target area of the semiconductor device;

forming an interlayer insulation film to cover the dummy gate electrodes and the dishing inhibiting pattern;

after covering the interlayer insulation film with a photoresist film, treating the photoresist film in stepper exposure and development to form a photoresist pattern of a photomask having its device pattern matched with the dummy gate electrodes and its alignment marks matched with the dishing inhibiting pattern or having its marks for forming inspection targets for misalignment matched with the same;

selectively etching the interlayer insulation film over the dummy gate electrodes and the dishing inhibiting pattern, with the photoresist pattern;

after removing the photoresist pattern, flattening the interlayer insulation film by means of chemical mechanical polishing to expose the surfaces of the dummy gate electrodes and the dishing inhibiting pattern, respectively; and removing the dummy gate electrodes and filling empties with a material to form gate electrodes.

According to further aspect of the invention, there is provided a method of manufacturing a semiconductor device, comprising:

forming dummy gate electrodes in a device formation area of a semiconductor device, and forming a dishing inhibiting pattern in a target area of the semiconductor device;

forming a nitride film to cover the dummy gate electrodes and the dishing inhibiting pattern, thereby setting side walls of the nitride film on opposite sides of each of the dummy gate electrodes;

covering the entire surface of the semiconductor substrate with an interlayer insulation film;

after covering the interlayer insulation film with a photoresist film, treating the photoresist film in stepper exposure and development to form a photoresist pattern of a photomask having its device pattern matched with the dummy gate electrodes and its alignment marks matched with the dishing inhibiting pattern or having its marks for forming inspection targets for misalignment matched with the same;

selectively etching the interlayer insulation film over the dummy gate electrodes and the dishing inhibiting pattern, with the photoresist pattern;

after removing the photoresist pattern, treating the interlayer insulation film and the nitride film in chemical mechanical polishing to expose the surfaces of the dummy gate electrodes and the dishing inhibiting pattern, respectively; and removing the dummy gate electrodes and filling empties with a material to form gate electrodes.

According to still further aspect of the invention, there is provided a method of manufacturing a semiconductor device, comprising:

forming dummy gate electrodes in a device formation area of a semiconductor device, and forming a dishing inhibiting pattern in a target area of the semiconductor device;

selectively etching the dishing inhibiting pattern to form pattern trenches;

depositing an interlayer insulation film to cover the dummy gate electrodes and the dishing inhibiting pattern and filling the pattern trenches with the interlayer insulation film to create targets in the dishing inhibiting pattern for alignment with a photomask;

after covering the interlayer insulation film with a photoresist film, treating the photoresist film in stepper exposure and development to form a photoresist pattern of the photomask having its device pattern matched with the dummy gate electrodes and its alignment marks matched with the targets in the dishing inhibiting pattern or having its marks for forming inspection targets for misalignment matched with the same;

selectively etching the interlayer insulation film over the dummy gate electrodes and the dishing inhibiting pattern, with the photoresist pattern;

after removing the photoresist pattern, flattening the interlayer insulation film by means of chemical mechanical polishing to expose the surfaces of the dummy gate electrodes and the dishing inhibiting pattern, respectively; and removing the dummy gate electrodes and filling the empties with a material to form gate electrodes.

According to another aspect of the invention, there is provided a semiconductor device having a first region provided with semiconductor devices and a second region provided with targets for alignment with a photomask, comprising:

a first pattern formed in the first region, a second pattern formed in the second region, an interlayer insulation film surrounding the first and second patterns and having its surface flattened, and alignment targets around the second pattern within lamination of the semiconductor substrate.

BRIEF DESCRIPTION OF THE DRAWINGS

FIGS. 2A and 2B are sectional views illustrating successive process stages of the damascene gate transistor manufacturing process subsequent to FIG. 1C;

FIGS. 3A and 3B are sectional views illustrating further successive process stages of the damascene gate transistor manufacturing process subsequent to FIG. 2B;

FIGS. 4A and 4B are sectional views illustrating still further successive process stages of the damascene gate transistor manufacturing process subsequent to FIG. 3B;

FIGS. 8A and 8B are sectional views illustrating further successive process stages of the damascene gate transistor manufacturing process subsequent to FIG. 7B;

FIGS. 9A and 9B are sectional views illustrating still further successive process stages of the damascene gate transistor manufacturing process subsequent to FIG. 8B;

FIGS. 11A and 11B are sectional views illustrating successive process stages of the damascene gate transistor manufacturing process subsequent to FIG. 10C;

FIGS. 12A and 12B are sectional views illustrating successive process stages subsequent to FIG. 11B;

FIGS. 13A and 13B are sectional views illustrating further successive process stages of the damascene gate transistor manufacturing process subsequent to FIG. 12B;

FIGS. 14A and 14B are sectional views illustrating still further successive process stages of the damascene gate transistor manufacturing process subsequent to FIG. 13B;

FIGS. 16A to 16C are sectional views illustrating earlier process stages of the damascene gate transistor manufacturing process in a fourth embodiment according to the present invention;

FIGS. 18A and 18B are sectional views illustrating additionally successive process stages of the damascene gate transistor manufacturing process subsequent to FIG. 17B;

FIGS. 19A and 19B are sectional views illustrating still further successive process stages of the damascene gate transistor manufacturing process subsequent to FIG. 18B;

DETAILED DESCRIPTION OF THE INVENTION

Embodiments of the present invention will now be described in conjunction with the accompanying drawings.

Embodiment 1

In this embodiment, provided in terms of the drawings will be a structure of the basic theory of avoiding the dishing in the interlayer insulation film around the mark area.

FIGS. 1A to 1C, FIGS. 2A and 2B, FIGS. 3A and 3B, and FIGS. 4A and 4B are sectional views illustrating a stepwise procedure of the damascene gate transistor manufacturing process in the first embodiment of the present invention.

For all the drawings, FIG. 1A to FIG. 4B, an area A1 on the left half of the figure represents a device formation area where devices such as damascene gate transistors are to be formed while an area A2 on the right half of the figure is indicative of a target area where targets for alignment with a photomask (reticle) or inspection targets for misalignment are to be formed.

Now, the manufacturing process of the damascene transistors will be explained in detail.

Figure 1A:
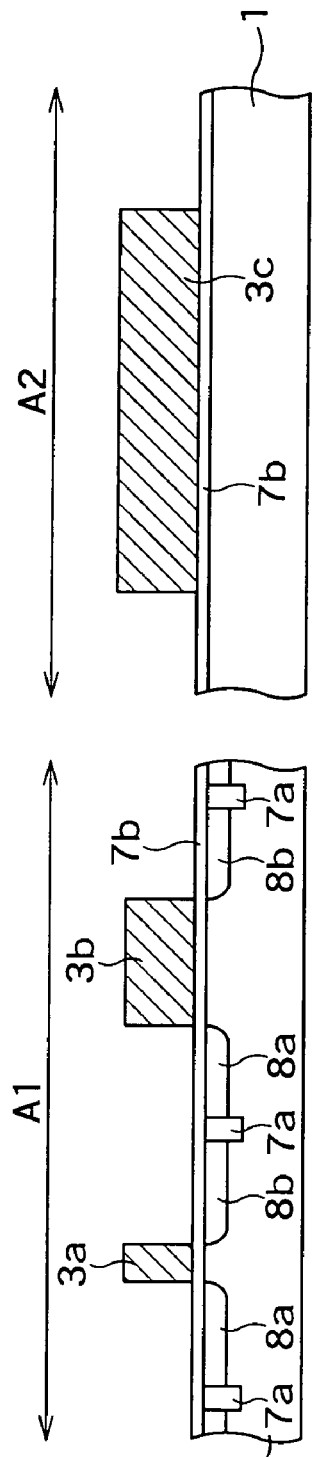
FIGS. 1A to 1C are sectional views illustrating earlier process stages of a damascene gate transistor manufacturing process in a first embodiment according to the present invention.

First, as shown in FIG. 1A, a silicon substrate 1, which is provided with shallow trench isolations (STIs) 7a serving as device isolation film in advance, is superposed with a buffer oxidation film 7b by, for example, thermal oxidation, and after that, polysilicon is deposited thereover and patterned to formedummy gate electrodes 3a and 3b in a first pattern. Simultaneously, a dummy gate electrode 3c is formed in a second pattern (or a dishing inhibiting pattern) in a position beneath the would-be mark area A3 in the target area A2 (see FIG. 2A), so as to function later to inhibit the interlayer insulation film from dishing around the mark area A3. The dummy gate electrode 3b is designed to be greater in a lateral width as seen in the figure than the dummy gate electrode 3a.

The above-mentioned mark area A3 is an area of photoresist film where there is an inspection mark for misalignment of the substrate with a photomask or a mark for alignment with the photomask during a lithography procedure. This is an area of the photoresist film that has a pattern, such as the marks for alignment with photomask, traced to provide for exposure of the substrate to light with the photomask.

Then, with the dummy gate electrodes 3a and 3b serving as the mask, impurity ions are implanted into the semiconductor substrate 1 and then diffused to form source and drain regions 8a and 8b.

Figure 1B:
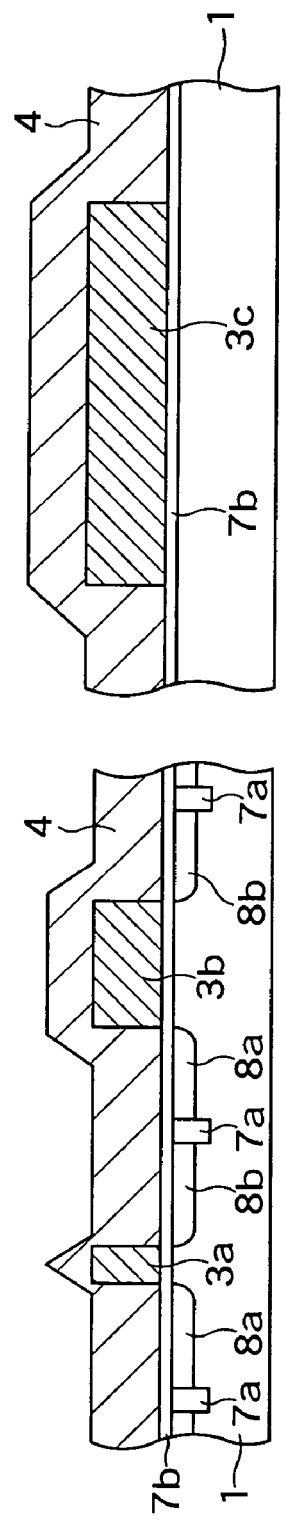

As illustrated in FIG. 1B, the interlayer insulation film 4 is deposited to cover the dummy gate electrodes 3a and 3b and the dishing inhibiting pattern 3c.

Figure 1C:
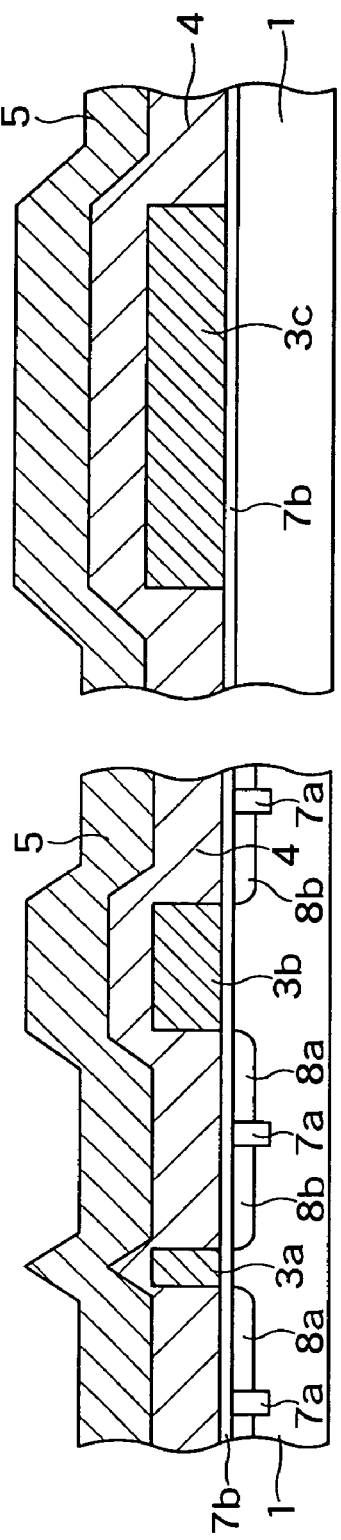

Then, as can be seen in FIG. 1C, the entire surface of the interlayer insulation film 4 is coated with a photoresist film 5 by means of spinning.

Figure 5:
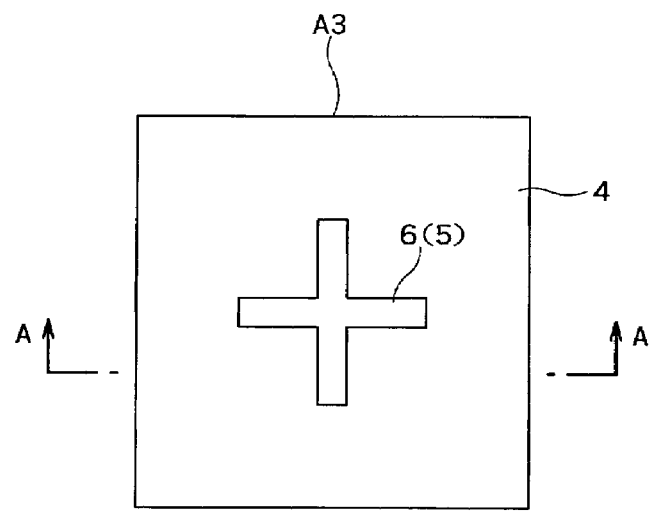
FIG. 5 is a plan view showing a mark area as in FIG. 2A.

Next, as shown in FIG. 2A, the photomask (not shown) and the substrate, after the alignment with each other, undergo exposure using a stepper and development so that the photomask has its device pattern traced over the photoresist mask above the dummy gate electrode 3b of a larger area. As a result of the alignment of the substrate with the photomask, the marks for forming inspection targets for misalignment of the photomask, or the marks for alignment precisely match in position with the dishing inhibiting pattern 3c. Thus, during the above-mentioned exposure and development, a pattern (i.e., a CMP auxiliary mask) 6 of the photoresist film should be formed above the dishing inhibiting pattern (dummy pattern) 3c, being precisely matched in position with the marks for inspection targets for misalignment or the marks for alignment. The CMP auxiliary mask 6 and the mark area A3 are depicted in a plan view of FIG. 5. As can be seen, the CMP auxiliary mask 6 assumes an almost cross-shaped plane pattern. A cross-section of the CMP auxiliary mask 6 along the line A—A in FIG. 5 is shown in FIG. 2A.

As can be seen in FIG. 2B, with the photoresist film 5 and the CMP auxiliary mask 6, the interlayer insulation film 4 is selectively removed by means of anisotropic etching such as reactive ion etching (RIE).

Then, as shown in FIG. 3A, the photoresist film 5 and the CMP auxiliary mask used during the etching are removed.

After that, as in FIG. 3B, the interlayer insulation film 4 is flattened by means of chemical mechanical polishing (CMP) to expose upper surfaces of the dummy gate electrodes 3a and 3b and the dishing inhibiting pattern 3c, respectively. The CMP is effected uniformly on the entire surface of the interlayer insulation film 4, and hence, the polishing residual on the dummy gate electrode 3b and the dishing inhibiting pattern 3c is accordingly reduced.

Then, as shown in FIG. 4A, the dummy gate electrodes 3a and 3b, and the dishing inhibiting pattern 3c along with their underlying buffer oxidation film 7b are etched away to form gate trenches 9a, 9b, and 9c, respectively.

Furthermore, as shown in FIG. 4B, a gate insulation film 20 of oxide is formed on the exposed surface of the silicon substrate 1 at the bottom of each of the gate trenches 9a, 9b, and 9c. Then, the gate trenches 9a, 9b and 9c are respectively filled with a material to have gate electrodes 10a and 10b (in a third pattern) and a similarly gate electrode 10c. Specifically, metal material for the gate electrodes is deposited in the gate trenches 9a, 9b and 9c, respectively, and then has its surface flattened by means of CMP to form the gate electrodes 10a, 10b and 10c, respectively. Alternatively, the filling of the gate trench 9c may be varied depending upon a desired application.

As has been described, in this embodiment, since the dishing inhibiting pattern is provided below the mark area previous to the interlayer insulation film formation stage, the deposition and subsequent CMP of the interlayer insulation film would not cause the interlayer insulation film to dish around the mark area. In other words, with reduced adverse effects on the desired pattern around the mark area, the damascene gate electrodes can be embedded in the interlayer insulation film.

The dishing inhibiting pattern (dummy pattern) formed below the mark area can be shaped in any pattern other than the cross as in the above by utilizing a mask that has alignment marks following alignment specifications of a scanner (a light exposure device) used during the patterning of the photoresist film.

Embodiment 2

In this embodiment, a modification of the first embodiment with additional particulars is provided. Disclosed below is a method where the damascene gate electrodes are formed after the stage of exposure and development of the silicon substrate with the targets formed for alignment in a target area of the silicon substrate being precisely matched in position with the marks for alignment in the photomask, thereby inhibiting the surrounding of the mark area from dishing.

FIGS. 6A to 6C, FIGS. 7A and 7B, FIGS. 8A and 8B, and FIGS. 9A and 9B show in cross-section the damascene gate transistor manufacturing process in a second embodiment according to the present invention.

Stepwise details of the damascene gate transistor manufacturing process will be provided below.

Figure 6A:
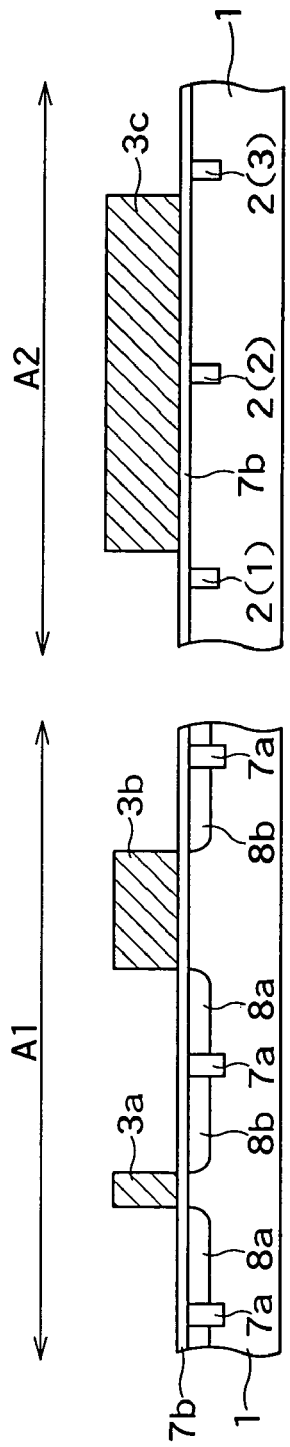
FIGS. 6A to 6C are sectional views illustrating earlier process stages of the damascene gate transistor manufacturing process in a second embodiment according to the present invention.

First, as shown in FIG. 6A, a silicon substrate 1, which is in advance provided with a shallow trench isolations (STIs) 7a serving as device isolation film and targets 2(1), 2(2), 2(3), and so forth used for alignment, has its surface formed with an oxidation film 7b by any appropriate means such as thermal oxidation, and after that, polysilicon is deposited thereover and then patterned to leave dummy gate electrodes 3a and 3b. Simultaneously, a dishing inhibiting pattern 3c is provided below a mark area A3 (see FIG. 7A). Next, with masks of the dummy gate electrodes 3a and 3b, impurity ions are implanted and diffused to form the source and drain regions 8a and 8b, respectively.

Figure 6B:
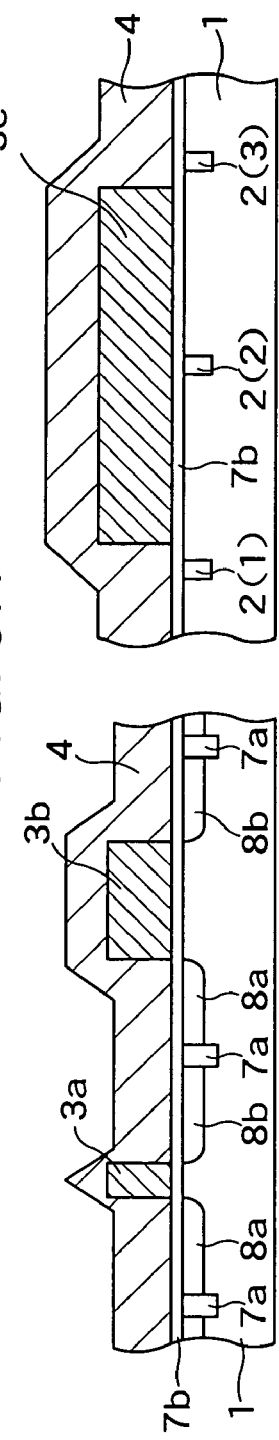

Then, as shown in FIG. 6B, the interlayer insulation film 4 is deposited to cover the dummy gate electrodes 3a and 3b and the dishing inhibiting pattern 3c.

Figure 6C:
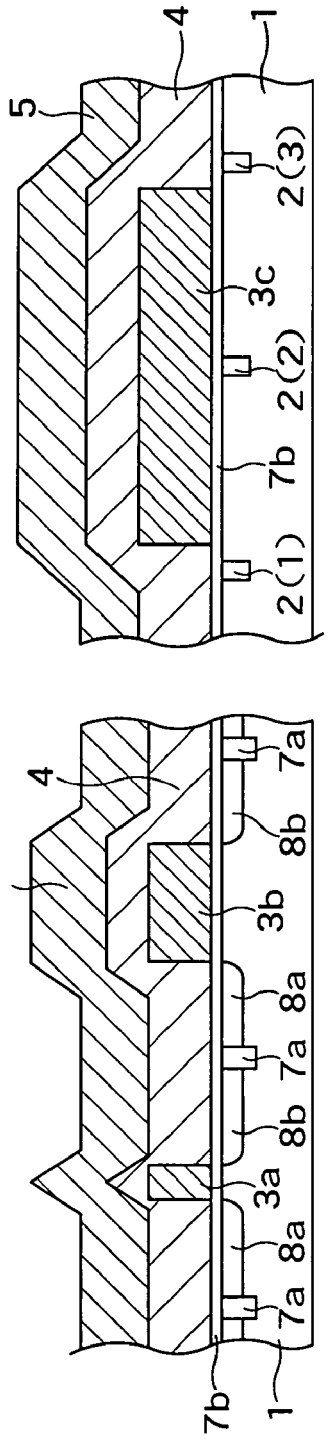

Furthermore, as shown in FIG. 6C, the entire surface of the interlayer insulation film 4 is coated with a photoresist film 5 by means of spinning.

Figure 7A:
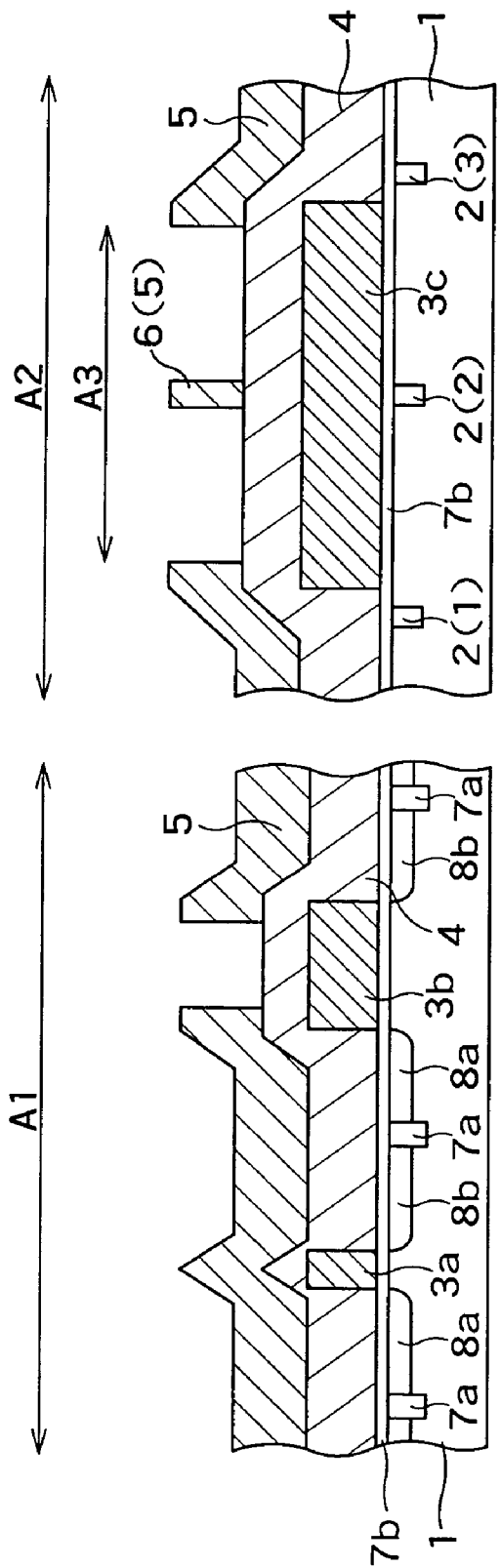
FIGS. 7A and 7B are sectional views illustrating successive process stages of the damascene gate transistor manufacturing process subsequent to FIG. 6C.

Next, as shown in FIG. 7A, a lithography method is used to create a pattern that is for selectively removing the interlayer insulation film 4 over the dummy gate electrode 3b. More specifically, for instance, the substrate undergoes treatments such as exposure to light and development, with one of marks for alignment with the photomask being precisely matched in position with the target 2(2) below the mark area A3. In this stage of the procedure, a CMP auxiliary mask 6 is provided in the mark area A3 of the photoresist film 5, having a pattern that matches the marks for alignment with the photomask.

After that, the substrate further undergoes the remaining steps similar to those in the first embodiment, and in this manner, the manufacturing process of damascene gate transistors is completed.

Figure 7B:
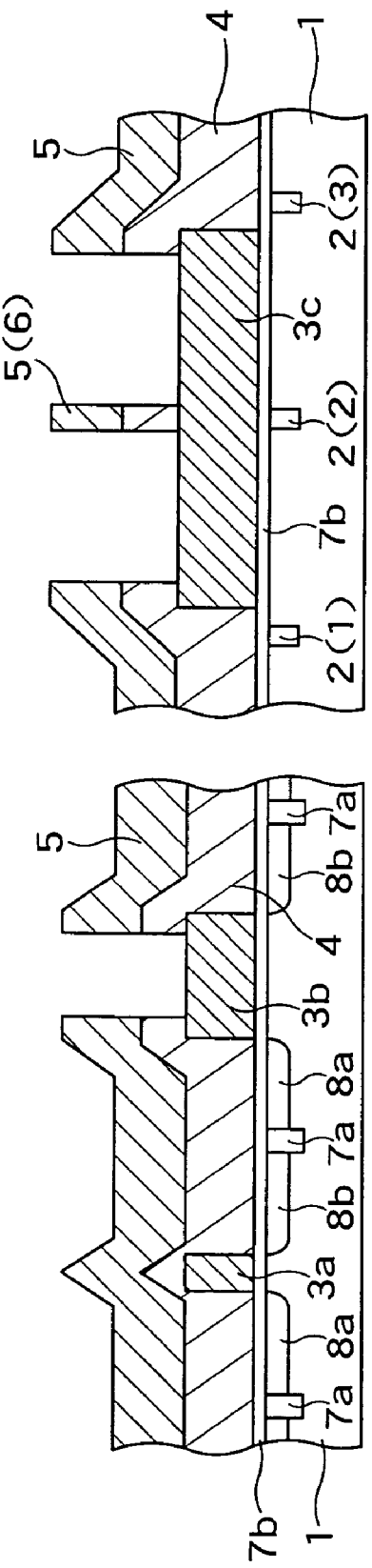

Thus, as can be seen in FIG. 7B, with the photoresist film 5 and the CMP auxiliary mask 6, the interlayer insulation film 4 over the dummy gate electrode 3b and the dishing inhibiting pattern 3c is selectively etched.

Then, as illustrated in FIG. 8A, the photoresist film 5 and the CMP auxiliary mask 6 used during the etching are removed.

Moreover, as shown in FIG. 8B, the interlayer insulation film 4 is flattened by means of CMP to expose upper surfaces of the dummy gate electrodes 3a and 3b and the dishing inhibiting pattern 3c.

Next, as shown in FIG. 9A, the dummy gate electrodes 3a and 3b, and the dishing inhibiting pattern 3c along with their underlying buffer oxidation film 7b are removed to form gate trenches 9a, 9b, and 9c, respectively.

After that, as depicted in FIG. 9B, a gate insulation film 20 is formed on the exposed surface of the silicon substrate 1 at the bottom of the gate trenches 9a, 9b, and 9c, respectively. The gate trenches 9a, 9b, and 9c are filled with a material to form gate electrodes 10a, 10b, and 10c, respectively.

As has been described, in this embodiment, since the dishing inhibiting pattern is provided below the mark area previous to the interlayer insulation film formation stage, the deposition and subsequent CMP of the interlayer insulation film would not cause the interlayer insulation film to dish around the mark area. Thus, should the targets 2(1) and 2(3) as in FIG. 9B be used for the alignment of the substrate with the photomask, the interlayer insulation film is inhibited from dishing above these targets 2(1) and 2(3) in the manner as stated above, and this brings about an enhanced accuracy in reading the targets 2(1) and 2(3). Such an enhancement of accuracy in reading the targets effectively reduces likeliness to cause interlayer misalignment over the substrate.

Embodiment 3

This embodiment provides a structure where damascene gate electrodes with side walls are formed while the surrounding of the mark area is inhibited from dishing.

FIGS. 10A to 10C, FIGS. 11A and 11B, FIGS. 12A and 12B, FIGS. 13A and 13B, and FIGS. 14A and 14B show in cross section the damascene gate transistor manufacturing process in a third embodiment according to the present invention.

Steps of the manufacturing process of damascene gate transistors will now be described.

Figure 10A:
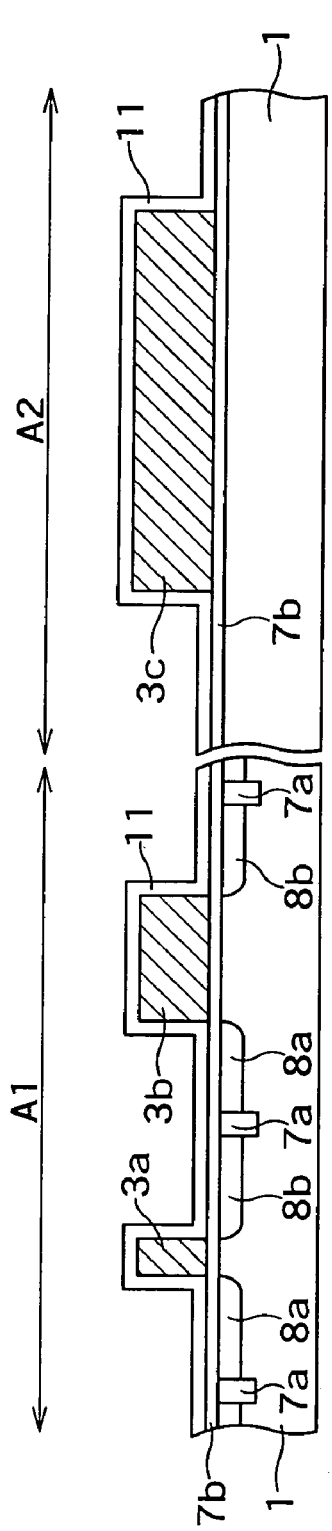
FIGS. 10A to 10C are sectional views illustrating earlier stages of the damascene gate transistor manufacturing process in a third embodiment according to the present invention.

First, as shown in FIG. 10A, a silicon substrate 1, which is provided in advance with shallow trench isolations (STIs) 7a serving as device isolation film, is formed with a buffer oxidation film 7b by, for example, thermal oxidation, and thereafter, polysilicon is deposited and then patterned to form dummy gate electrodes 3a and 3b and a dishing inhibiting pattern 3c. Then, impurities are implanted in the silicon substrate 1 to form source and drain regions 8a and 8b.

Next, as depicted in FIG. 10A, the entire surface of the substrate is covered with a silicon nitride film 11 that forms a lateral width of trenches for damascene gates.

Figure 10B:
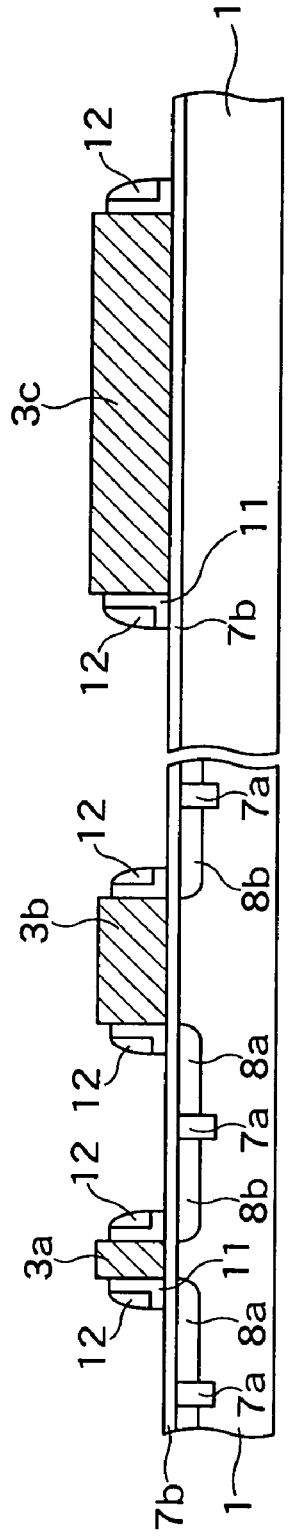
Figure 10C:
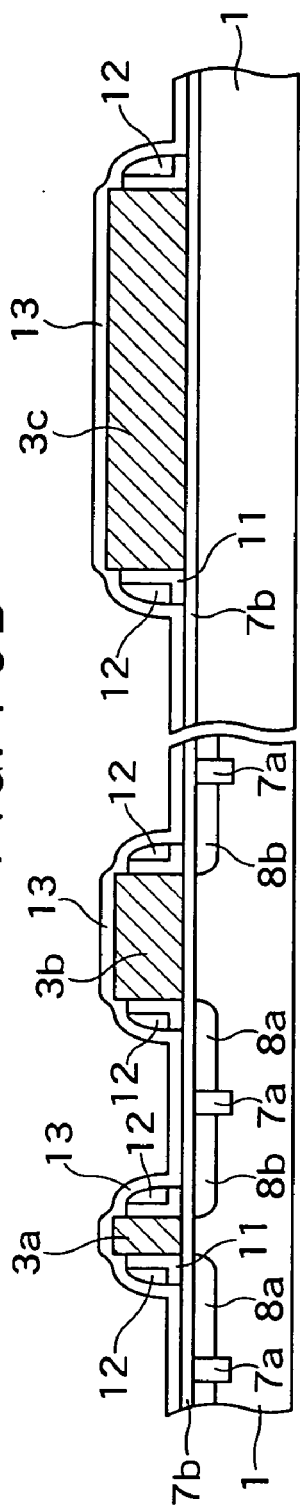

Then, as can be seen in FIGS. 10B and 10C, side walls of the dummy gate electrodes 3a and 3b and the dishing inhibiting pattern 3c are made. More specifically, after the entire surface of the substrate is coated with an oxide film by means of chemical vapor deposition (CVD), the oxide film and the nitride film 11 are etched back by RIE to leave a silicon oxide film 12 in opposite sides of the dummy gate electrodes 3a and 3b and the dishing inhibiting pattern 3c, respectively, as depicted in FIG. 10B. After that, silicon nitride is deposited to coat the surface with a silicon nitride film 13 as shown in FIG. 10C.

After that, the substrate further undergoes various stages similar to those in the first embodiment, and finally, the manufacturing process of the damascene gate transistors is completed.

Thus, as shown in FIG. 11A, an interlayer insulation film 4 is deposited all over the surface.

Furthermore, as shown in FIG. 11B, the entire surface of the interlayer insulation film 4 is coated with a photoresist film 5 by an appropriate means like spinning.

Furthermore, as shown in FIG. 12A, a lithography method is utilized to create a pattern used for selective elimination of the interlayer insulation film 4 over the dummy gate electrode 3b. Simultaneously, a CMP auxiliary mask 6 should be made in the mark area A3 of the photoresist film 5.

Then, as can be seen in FIG. 12B, with the photoresist film 5 and the CMP auxiliary mask 6, the interlayer insulation film 4 over the dummy gate electrode 3b and the dishing inhibiting pattern 3c is selectively etched.

Next, as in FIG. 13A, the photoresist film 5 and the CMP auxiliary mask 6 used during the etching are removed.

After that, as shown in FIG. 13B, the interlayer insulation film 4 is flattened by means of CMP to expose upper surfaces of the dummy gate electrodes 3a and 3b and the dishing inhibiting pattern 3c, respectively.

Furthermore, as shown in FIG. 14A, the dummy gate electrodes 3a and 3b, and the dishing inhibiting pattern 3c along with their underlying buffer oxidation film 7b are removed to form gate trenches 9a, 9b, and 9c, respectively.

Furthermore, as shown in FIG. 14B, a gate insulation film 20 is formed on the exposed surface of the silicon substrate 1 at the bottom of the gate trenches 9a, 9b, and 9b, respectively. Then, the gate trenches 9a, 9b, and 9c are filled with a material to form gate electrodes 10a, 10b, and 10c, respectively.

Figure 15A:
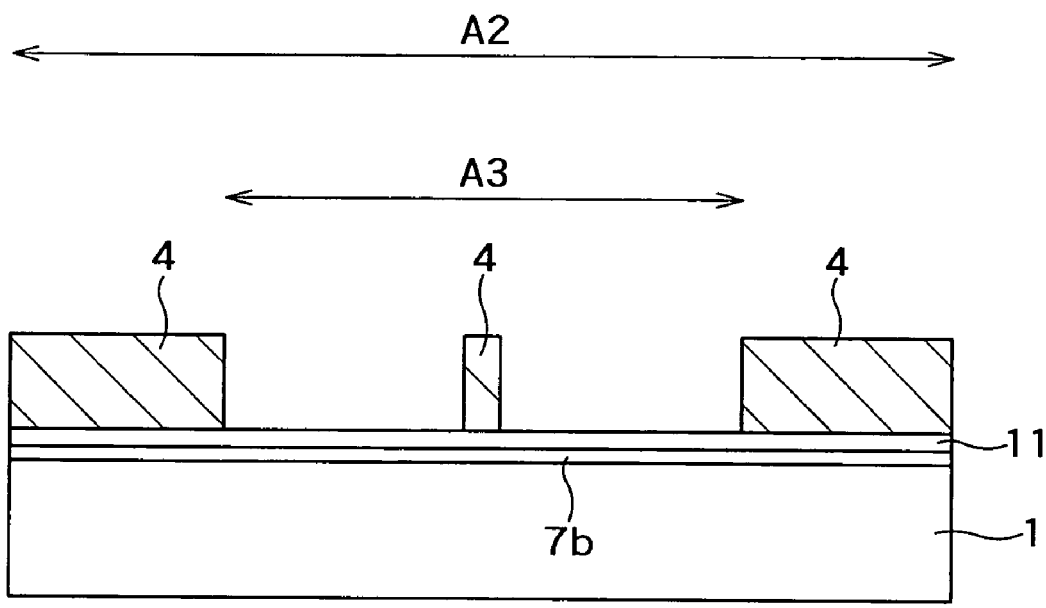
FIGS. 15A and 15B are sectional views of part of applicant's previous procedure of manufacturing a damascene gate electrode with side walls, which correspond to the third embodiment according to the present invention.
Figure 15B:
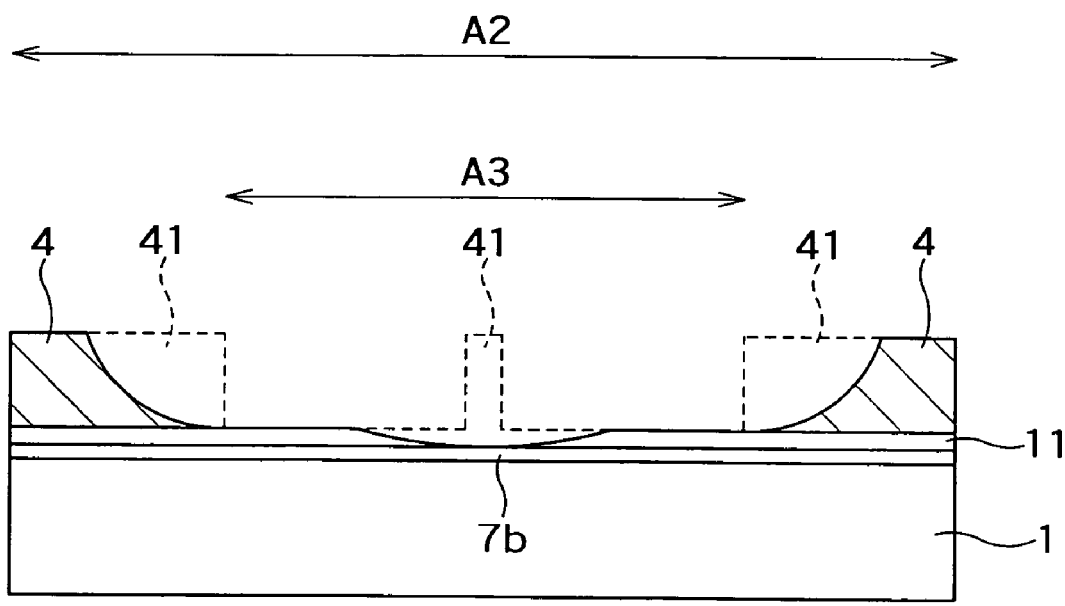

FIGS. 15A and 15B depict part of applicant's previous manufacturing process of the damascene gate electrodes with side walls, focused on the target area A2. As can be seen in FIG. 15B, the interlayer insulation film 4 dishes around the mark area A3 during the CMP procedure as designated by a reference numeral 41, and this causes adverse effects on the pattern around the mark area A3.

As has been described, also in this embodiment where it is intended that the damascene gate electrodes with side walls are made, the interlayer insulation film is inhibited from dishing around the mark area.

Embodiment 4

This embodiment provides a structure where targets for alignment with the photomask are provided in a target area in the identical layer having the dummy gate electrodes, and the surrounding of the mark area is inhibited from dishing by using the targets for the alignment of the substrate with the photomask.

FIGS. 16A to 16C, FIGS. 17A and 17B, FIGS. 18A and 18B, and FIGS. 19A and 19B depict in cross section the damascene gate transistor manufacturing process in a fourth embodiment according to the present invention.

Stepwise details of the damascene gate transistor manufacturing process will now be described.

First, as shown in FIG. 16A, a silicon substrate 1, which is provided in advance with shallow trench isolations (STIs) 7a, is formed with dummy gate electrodes 3a and 3b, and a dishing inhibiting pattern 3c, having an interposing buffer oxidation film 7b. Then, with a mask of the dummy gate electrodes 3a and 3b, impurities are implanted in the silicon substrate 1 to form source and drain regions 8a and 8b.

Then, as shown in FIG. 16A, a trench pattern 14, which is used for forming targets for alignment with the photomask, is made in the dishing inhibiting pattern 3c by a lithography method.

Next, as illustrated in FIG. 16B, an interlayer insulation film 4 is deposited to cover the dummy gate electrodes 3a and 3b, and the dishing inhibiting pattern 3c. Simultaneous with this, the interlayer insulation film 4 fills the trench pattern 14 in the dishing inhibiting pattern 3c, and hence, targets 15 for alignment are formed (see FIG. 20).

Next, as shown in FIG. 16C, the entire surface of the interlayer insulation film 4 is covered with the photoresist film 5.

Figure 20:
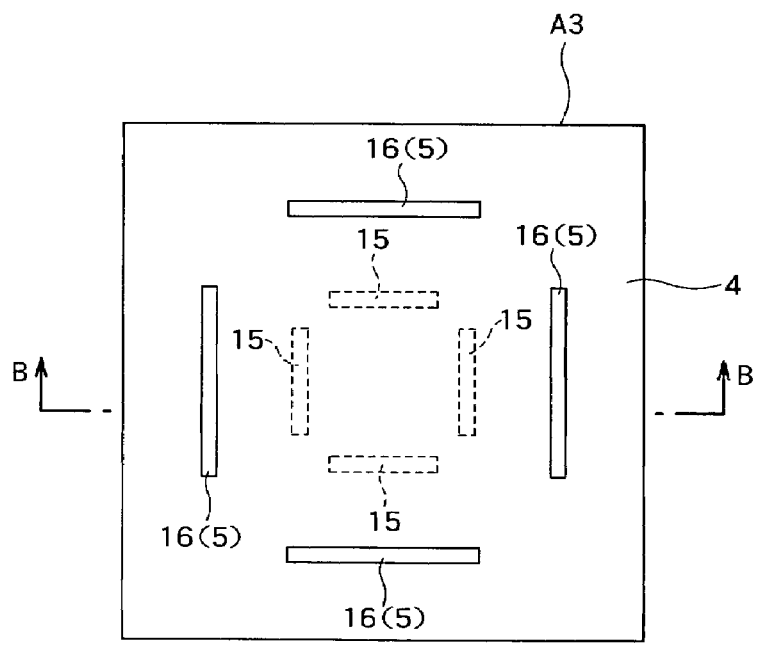
FIG. 20 is a plan view showing a mark area in FIG. 17A.
Figure 17A:
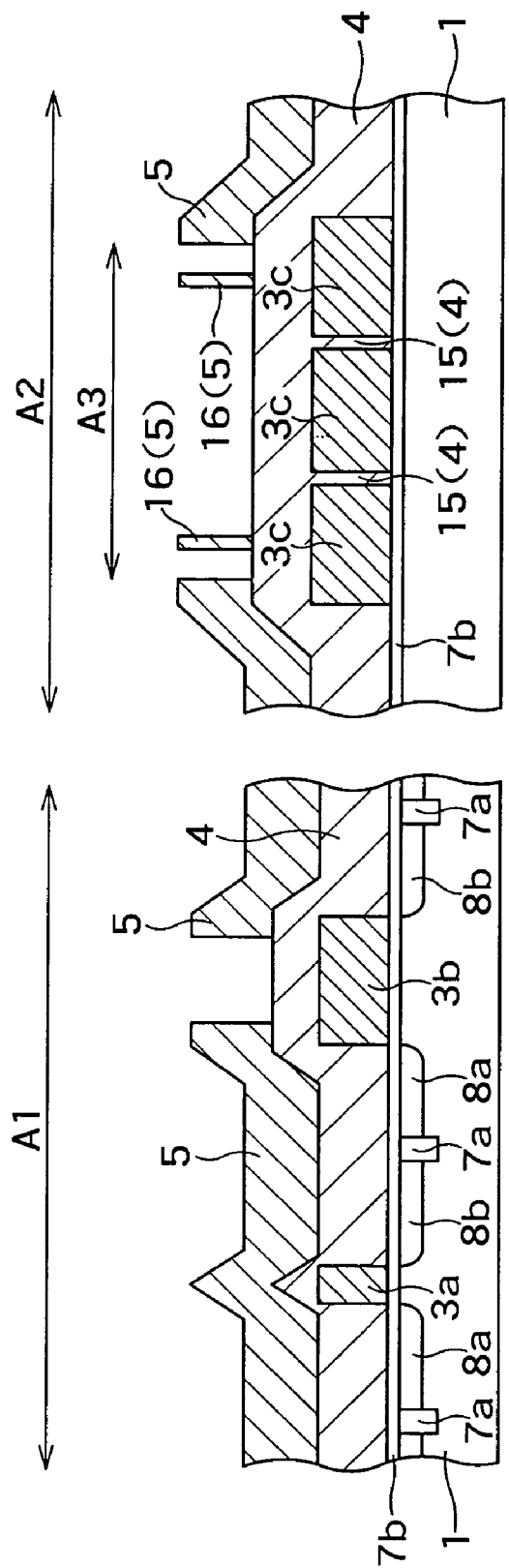
FIGS. 17A and 17B are sectional views illustrating successive process stages of the damascene gate transistor manufacturing process subsequent to FIG. 16C.

Further, as can be seen in FIG. 17A, a lithography method is utilized to create a pattern that is for selectively removing the interlayer insulation film 4 over the dummy gate electrode 3b. Specifically, alignment of the photomask with the substrate is attained by precisely matching one of marks for alignment in the photomask in position with the targets 15 in the dishing inhibiting pattern 3c. In this state of the alignment, the substrate undergoes treatments such as exposure to light and development. During these procedures, as shown in FIG. 17A, a CMP auxiliary mask 16 is formed in the mark area A3 in the photoresist film 5, having precise matching in position with the marks in the photomask. The mark area A3 including the CMP auxiliary mask 16 is depicted in plan view in FIG. 20. A section of the CMP auxiliary mask 16 along the line B—B in FIG. 20 is shown in FIG. 17A.

After that, the substrate undergoes various stages similar to those in the first embodiment, and finally, the manufacturing process of the damascene gate transistors is completed.

Figure 17B:
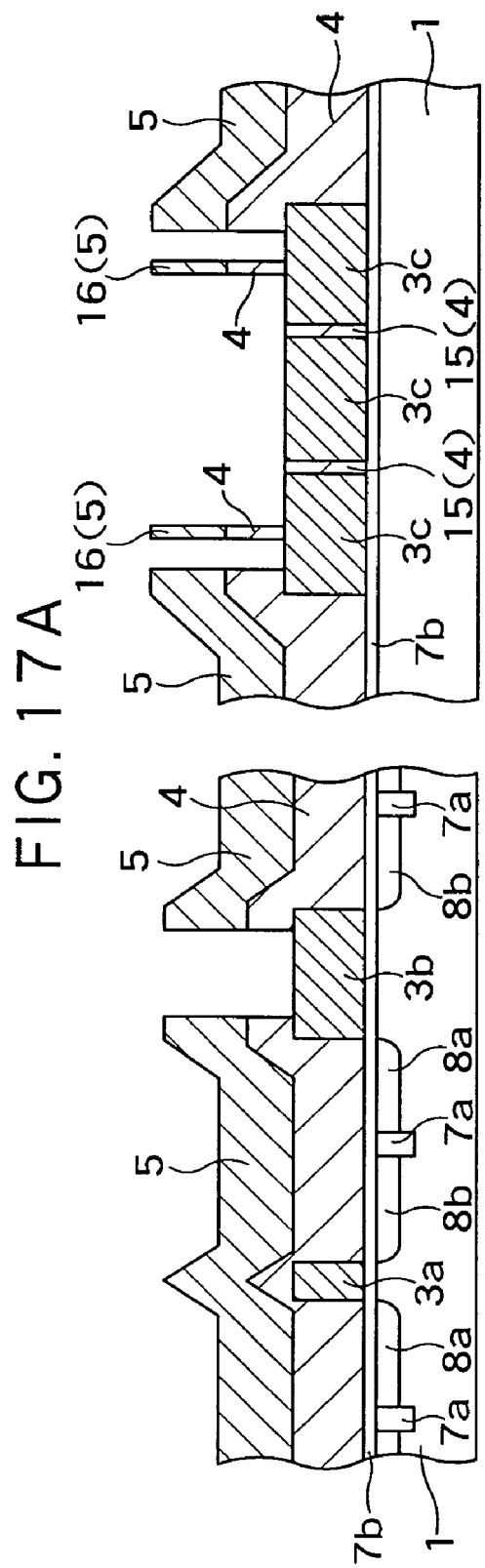

Thus, as shown in FIG. 17B, with the photoresist film 5 and the CMP auxiliary mask 6, the interlayer insulation film 4 over the dummy gate electrode 3b and the dishing inhibiting pattern 3c is selectively etched.

Then, as depicted in FIG. 18A, the photoresist film 5 and the CMP auxiliary mask 16 used during the etching are removed.

Next, as can be seen in FIG. 18B, the interlayer insulation film 4 is flattened by CMP to expose upper surfaces of the dummy gate electrodes 3a and 3b and the dishing inhibiting pattern 3c, respectively.

Furthermore, as shown in FIG. 19A, the dummy gate electrodes 3a and 3b and the dishing inhibiting pattern 3c along with their underlying buffer oxidation film 7b are removed to form gate trenches 9a, 9b and 9c, respectively.

Further, as shown in FIG. 19B, a gate insulation film 20 is formed on the exposed surface of the silicon substrate 1 at the bottom of the gate trenches 9a, 9b and 9c, respectively. Then, the gate trenches 9a, 9b and 9c are filled with a material to form gate electrodes 10a, 10b and 10c, respectively.

FIGS. 21A to 21D depict part of applicant's previous damascene gate electrode formation procedure, focused on the target area A2.

Figure 21A:
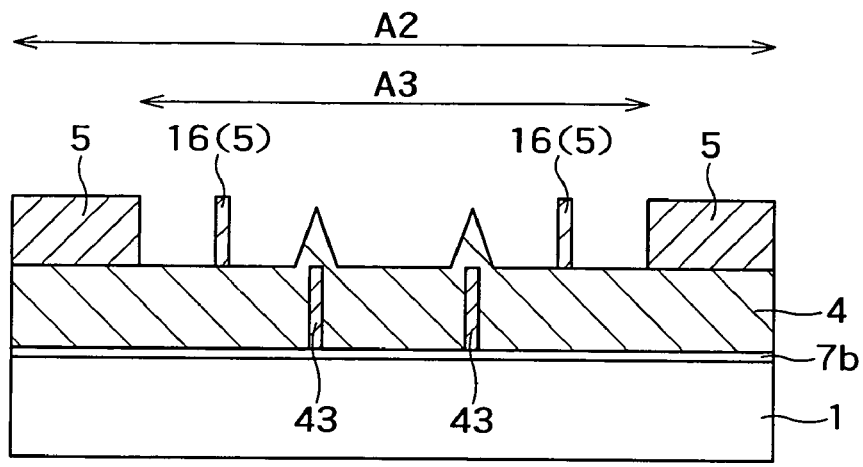
FIGS. 21A to 21D are sectional views illustrating part of applicant's previous damascene gate transistor manufacturing process, which correspond to the fourth embodiment according to the present invention.
Figure 21B:
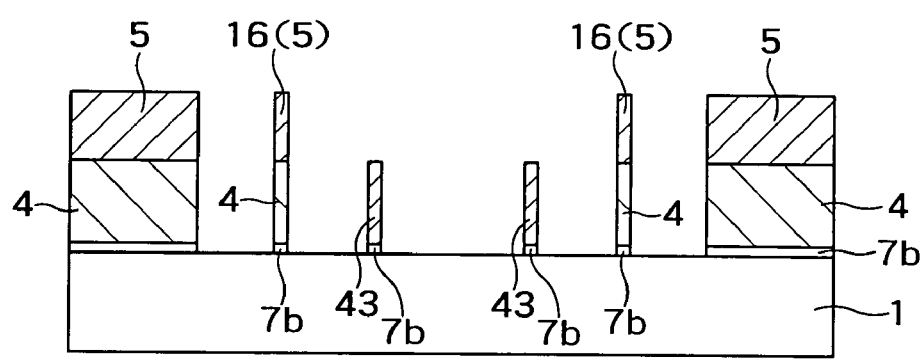
Figure 21C:
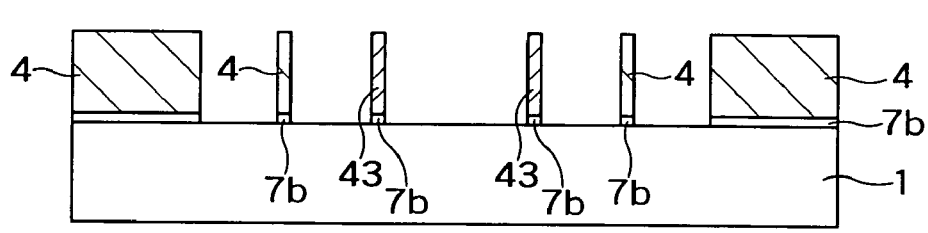
Figure 22:
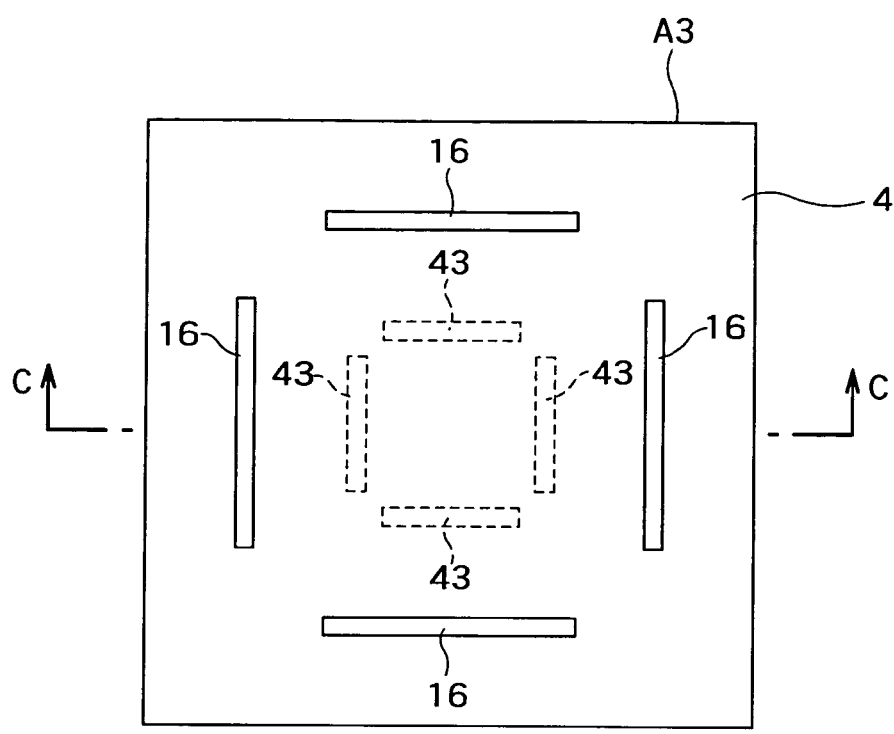
FIG. 22 is a plan view showing a mark area in FIG. 21A.
Figure 26:
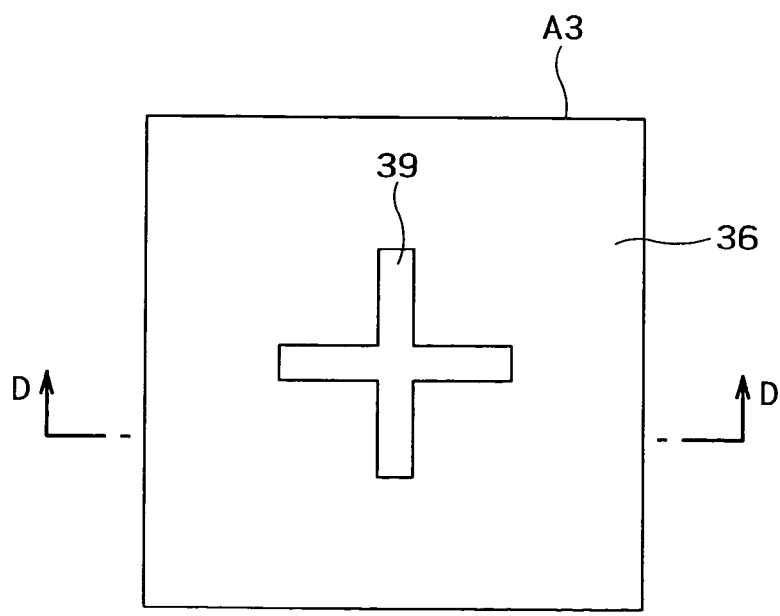
FIG. 26 is a plan view showing a mark area in FIG. 24A.
Figure 23A:
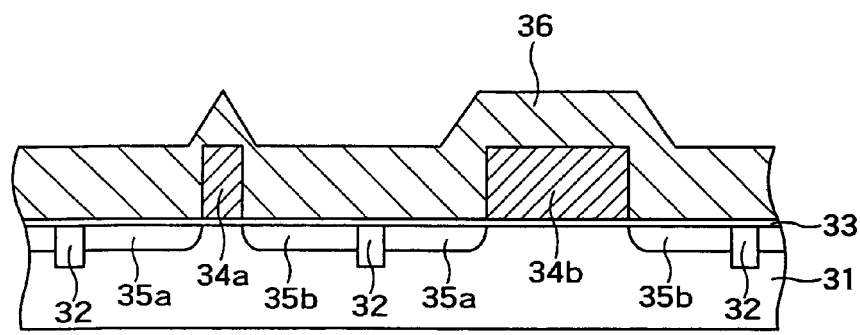
FIGS. 23A to 23C are sectional views illustrating part of a prior art damascene gate transistor manufacturing method.
Figure 23B:
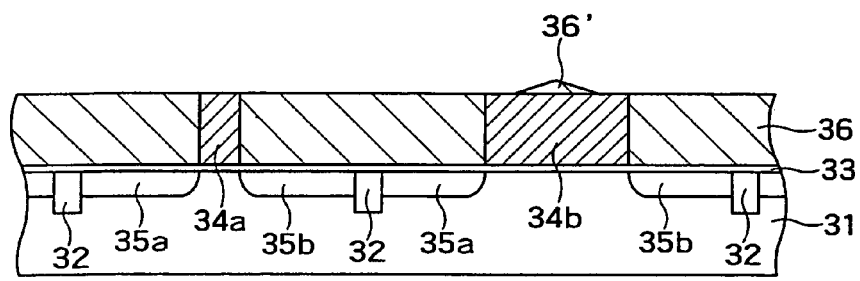
Figure 23C:
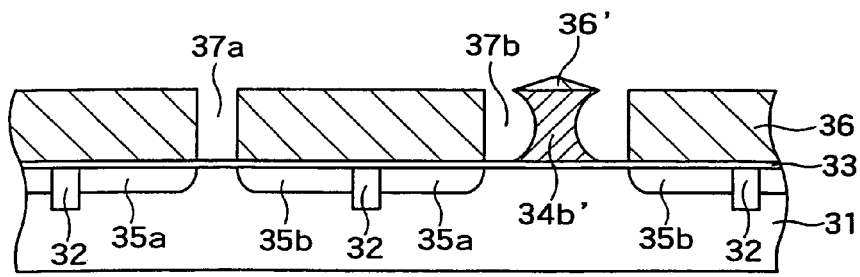
Figure 24A:
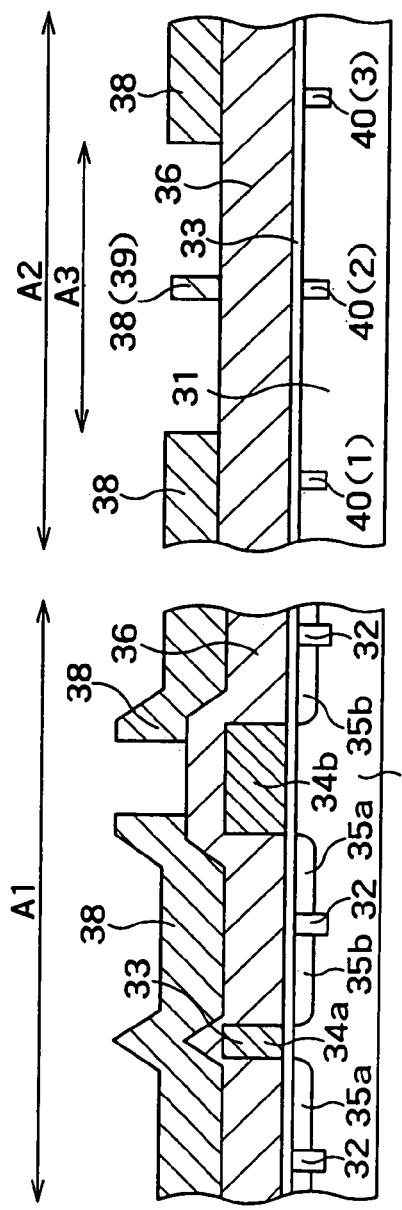
FIGS. 24A to 24C are sectional views illustrating earlier process stages of the prior art damascene transistor manufacturing process.
Figure 24B:
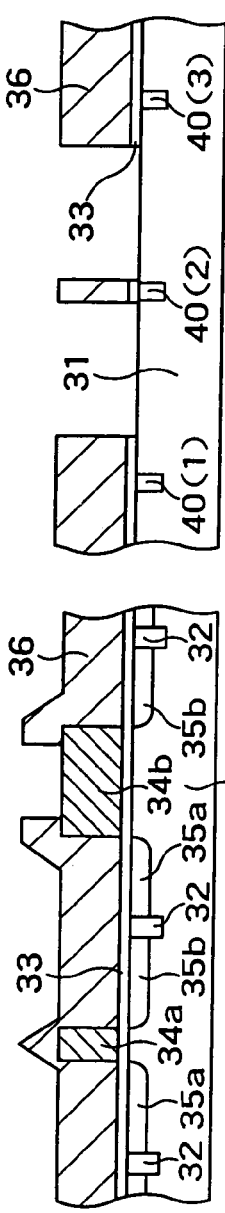
Figure 24C:
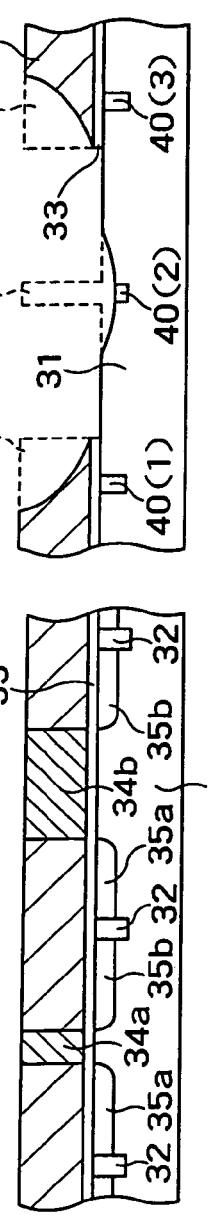
Figure 25A:
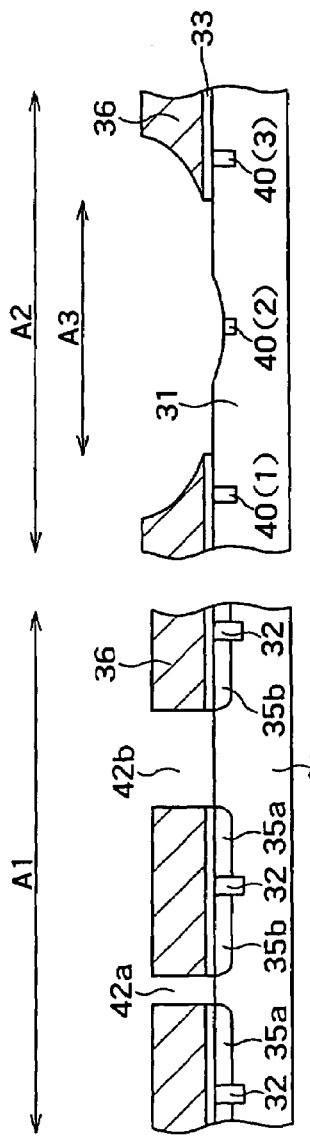
FIGS. 25A and 25B are sectional views illustrating successive process stages of the prior art damascene gate transistor manufacturing process subsequent to FIG. 24B.
Figure 25B:
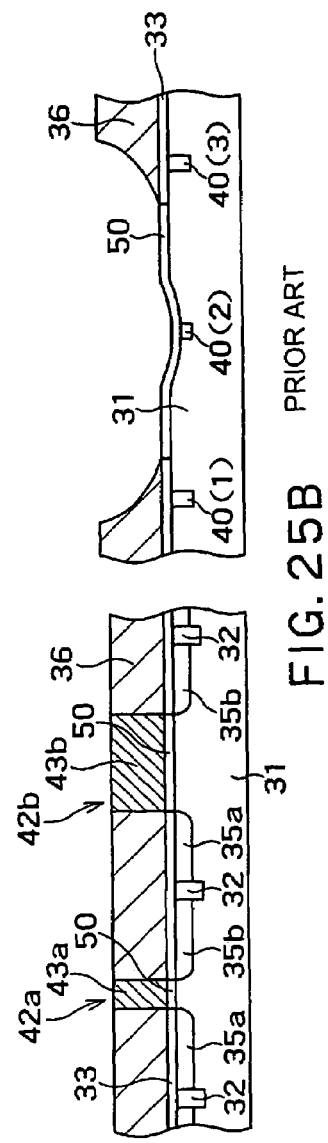

FIG. 22 is a plan view showing targets 43 and a CMP auxiliary mask 16 in FIG. 21A. Sections of the targets 43 and the CMP auxiliary mask 16 along the line C—C in FIG. 22 are shown in FIG. 21A.

Figure 21D:
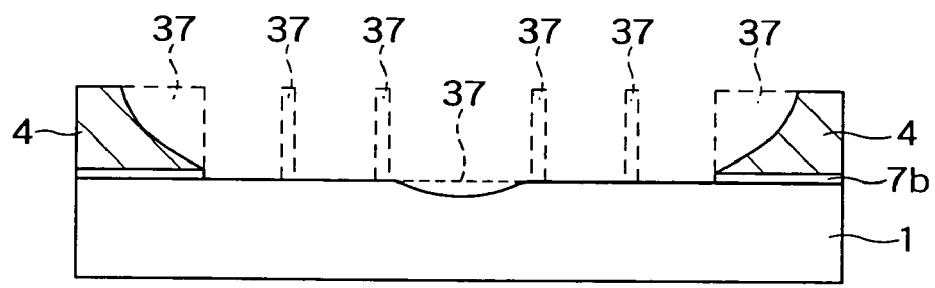

As shown in FIG. 21D, the interlayer insulation film 4 dishes around the mark area A3 as designated by a reference numeral 37, and this causes adverse effects upon the pattern of the interlayer insulation film 4. In this example, as recognized in FIG. 21A, the targets (alignment lines 43 assume a positive posture while the targets in this embodiment are configured in an inverted or negative pattern, as depicted in FIG. 19B.

As has been described, in this embodiment, the interlayer insulation film is inhibited from dishing around the mark area. In addition to that, since the targets for alignment are buried in the dishing inhibiting pattern, the CMP would not have the buried targets dissipated. Thus, the buried targets can also be used for alignment during succeeding stages of the process.

The present invention should not be limited to any mode in the aforementioned embodiments, but instead, various modifications can be made without departing the true scope of the invention.

For instance, the CMP auxiliary mask configured to match in position with the marks in the photomask is not limited to the precise shapes as disclosed in the aforementioned embodiments. Also, the dummy pattern (dishing inhibiting pattern) formed in the identical layer having the dummy gates are not restricted to the forms as in those embodiments.

The patterns of the alignment targets and the inspection targets for misalignment include machine inspection patterns, visual inspection vernier patterns, and the like.

The embodiments of the present invention can be suitable for applications where device patterns of STIs, interconnection layers, and other elements, as well as the application of formation of damascene gate electrodes.

In the aforementioned embodiments, the dummy gate electrodes are configured in a single layer arrangement simply made of polycrystalline silicon film, but alternatively, they may be a dual layer arrangement of polycrystalline silicon film and silicon nitride film.

Although the gate electrodes filled in the gate trenches are formed by CMP in these embodiments, they can be formed by any of the lithography method, and anisotropic etching such as RIE. Also, the gate electrodes do not have to be made of a single metal as in the above disclosure, but instead, mixed or reacted alloy of more than one metals may be used. A plurality of the gate electrodes formed in the substrate do not have to be identical in configuration, but they may be varied in type and configuration in a single substrate.

Moreover, in the aforementioned embodiments, the gate insulation films are of oxide film, but alternatives to that include deposition films, dielectric and hyper-dielectric films, and the like.

In accordance with the present invention, a reduction of interlayer's tendency to dish around the mark area brings about a reduction of misalignment of multi layers stacked over the substrate, and this also effectively enhances yields.

What is claimed is:

1. A method of manufacturing a semiconductor device, comprising:
    forming a first pattern in a first region over a semiconductor substrate;
    forming a second pattern in a second region separated from the first region over the semiconductor substrate;
    depositing an interlayer insulation film to cover the first and second patterns, the interlayer insulation film filling a region between the first and second patterns;
    forming a photoresist film on the interlayer insulation film;
    treating the photoresist film in stepper exposure and development to form a photoresist pattern of a photomask having its device pattern matched with the first pattern and its alignment marks matched with the second pattern;
    selectively etching off the interlayer insulation film over the first and second patterns, with the photoresist pattern; and
    after removing the photoresist pattern, flattening the interlayer insulation film to expose the surfaces of the first and second patterns, respectively.

2. A method according to claim 1, wherein the flattening the interlayer insulation film is performed by chemical mechanical polishing the interlayer insulation film.

3. A method according to claim 1, wherein the photomask is provided with marks for forming inspection targets for misalignment, and the step of forming a second pattern includes, prior to the depositing an interlayer insulation film, forming the second pattern that matches with the marks for forming inspection targets for misalignment.

4. A method according to claim 1, further comprising: after flattening the interlayer insulation film, removing the first pattern to form trenches, and filling the trenches with a material to create a third pattern.

5. A method according to claim 4, wherein the forming a third embedded pattern includes defining transistor gate electrodes in that pattern.

6. A method according to claim 5, further comprising:
    prior to depositing an interlayer insulation film, implanting impurities in the semiconductor substrate to form transistor source and drain regions, with a mask of the first pattern.

7. A method according to claim 4, wherein the removing the first pattern includes simultaneously removing the second pattern to form trenches, and thereafter filling the trenches with the identical material to that for the third pattern.

8. A method according to claim 1, wherein the first and second patterns are simultaneously formed in a single forming using the same material.

9. A method according to claim 1, wherein the photoresist pattern over the second pattern is shaped in an almost cross-like plane pattern.

10. A method of manufacturing a semiconductor device, comprising:
    forming dummy gate electrodes in a device formation area of a semiconductor device, and forming a dishing inhibiting pattern in a target area of the semiconductor device;
    forming an interlayer insulation film to cover the dummy gate electrodes and the dishing inhibiting pattern;
    after covering the interlayer insulation film with a photoresist film, treating the photoresist film in stepper exposure and development to form a photoresist pattern of a photomask having its device pattern matched with the dummy gate electrodes and its alignment marks matched with the dishing inhibiting pattern or having its marks for forming inspection targets for misalignment matched with the same;
    selectively etching the interlayer insulation film over the dummy gate electrodes and the dishing inhibiting pattern, with the photoresist pattern;
    after removing the photoresist pattern, flattening the interlayer insulation film by means of chemical mechanical polishing to expose the surfaces of the dummy gate electrodes and the dishing inhibiting pattern, respectively; and
    removing the dummy gate electrodes and filling with a material to form gate electrodes.

11. A method of manufacturing a semiconductor device, comprising:
    forming dummy gate electrodes in a device formation area of a semiconductor device, and forming a dishing inhibiting pattern in a target area of the semiconductor device;
    forming a nitride film to cover the dummy gate electrodes and the dishing inhibiting pattern, thereby setting side walls of the nitride film on opposite sides of each of the dummy gate electrodes;
    covering the entire surface of the semiconductor substrate with an interlayer insulation film;
    after covering the interlayer insulation film with a photoresist film, treating the photoresist film in stepper exposure and development to form a photoresist pattern of a photomask having its device pattern matched with the dummy gate electrodes and its alignment marks matched with the dishing inhibiting pattern or having its marks for forming inspection targets for misalignment matched with the same;
    selectively etching the interlayer insulation film over the dummy gate electrodes and the dishing inhibiting pattern, with the photoresist pattern;
    after removing the photoresist pattern, treating the interlayer insulation film and the nitride film in chemical mechanical polishing to expose the surfaces of the dummy gate electrodes and the dishing inhibiting pattern, respectively; and
    removing the dummy gate electrodes and filling with a material to form gate electrodes.

12. A method of manufacturing a semiconductor device, comprising:
    forming dummy gate electrodes in a device formation area of a semiconductor device, and forming a dishing inhibiting pattern in a target area of the semiconductor device;
    selectively etching the dishing inhibiting pattern to form pattern trenches;
    depositing an interlayer insulation film to cover the dummy gate electrodes and the dishing inhibiting pattern and filling the pattern trenches with the interlayer insulation film to create targets in the dishing inhibiting pattern for alignment with a photomask;
    after covering the interlayer insulation film with a photoresist film, treating the photoresist film in stepper exposure and development to form a photoresist pattern of the photoresist having its device pattern matched with the dummy gate electrodes and its alignment marks matched with the targets in the dishing inhibiting pattern or having its marks for forming inspection targets for misalignment matched with the same;

selectively etching the interlayer insulation film over the dummy gate electrodes and the dishing inhibiting pattern, with the photoresist pattern;

after removing the photoresist pattern, flattening the interlayer insulation film by means of chemical mechanical polishing to expose the surfaces of the dummy gate electrodes and the dishing inhibiting pattern, respectively; and removing the dummy gate electrodes to obtain gate trenches and filling the gate trenches with material of electrode to form gate electrodes.

* * * * *